(12) United States Patent
Hayashi

(10) Patent No.: US 8,928,785 B2
(45) Date of Patent: *Jan. 6, 2015

(54) IMAGING DEVICE AND STORAGE MEDIUM STORING AN IMAGING PROGRAM

(71) Applicant: FUJIFILM Corporation, Tokyo (JP)

(72) Inventor: Kenkichi Hayashi, Saitama (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/021,536

(22) Filed: Sep. 9, 2013

(65) Prior Publication Data

US 2014/0009655 A1  Jan. 9, 2014

Related U.S. Application Data

(63) Continuation of application No. PCT/JP2011/067544, filed on Jul. 29, 2011.

(30) Foreign Application Priority Data

Mar. 11, 2011 (JP) ................................ 2011-054631
Jul. 26, 2011 (JP) ................................ 2011-163306

(51) Int. Cl.

| | |
|---|---|
| *H04N 5/335* | (2011.01) |
| *H04N 9/07* | (2006.01) |
| *H04N 9/083* | (2006.01) |
| *H01L 27/146* | (2006.01) |
| *H04N 9/04* | (2006.01) |
| *G06T 3/40* | (2006.01) |

(52) U.S. Cl.
CPC .......... *H01L 27/14621* (2013.01); *H04N 9/045* (2013.01); *H04N 9/07* (2013.01); *G06T 3/4015* (2013.01); *H04N 2209/046* (2013.01)
USPC ............. 348/273; 348/266; 348/272; 348/280

(58) Field of Classification Search
CPC ..... H04N 5/3696; H04N 9/045; H04N 9/077; H04N 3/1575; H04N 3/1581
USPC ............. 348/273–283, 349, 345, 222.1, 340, 348/294, 302, 220.1, 224.1, 230, 272, 266; 382/300; 250/201.2; 396/124
See application file for complete search history.

(56) References Cited

U.S. PATENT DOCUMENTS

| | | | |
|---|---|---|---|
| 5,604,530 A | 2/1997 | Saito et al. | |
| 6,343,146 B1 * | 1/2002 | Tsuruoka et al. | ............. 382/163 |

(Continued)

FOREIGN PATENT DOCUMENTS

| | | |
|---|---|---|
| EP | 2 666 726 A1 | 1/2014 |
| JP | 8-023542 A | 1/1996 |

(Continued)

OTHER PUBLICATIONS

International Search Report issued in International Application No. PCT/JP2011/067544 on Sep. 6, 2012.

(Continued)

*Primary Examiner* — Sinh Tran
*Assistant Examiner* — Xi Wang
(74) *Attorney, Agent, or Firm* — Birch, Stewart, Kolasch & Birch, LLP

(57) ABSTRACT

An imaging apparatus and image capture program are provided that enable an image processing section compatible with a Bayer array to be employed without modification even in cases in which an image pickup device is employed that is provided with a color filter of an array other than a Bayer array.

An imaging apparatus (10) includes a color filter (30) having repeatedly disposed 6×6 pixel basic array patterns C, a drive section (22) that drives an image pickup device (14) so as to thin and read pixel data only of pixels on lines at predetermined positions in the vertical direction, and a pixel conversion processing section (18) that converts pixel data of each line thinned and read from the image pickup device (14) into Bayer array pixel data that is in a Bayer array pattern.

21 Claims, 24 Drawing Sheets

(56) References Cited

U.S. PATENT DOCUMENTS

| | | | |
|---|---|---|---|
| 6,995,796 B2* | 2/2006 | Taubman | 348/280 |
| 7,745,779 B2* | 6/2010 | Conners | 250/226 |
| 2002/0149686 A1* | 10/2002 | Taubman | 348/272 |
| 2004/0109068 A1* | 6/2004 | Mitsunaga et al. | 348/222.1 |
| 2004/0169747 A1* | 9/2004 | Ono et al. | 348/272 |
| 2006/0092304 A1* | 5/2006 | Hirota | 348/311 |
| 2006/0203113 A1 | 9/2006 | Wada et al. | |
| 2007/0153104 A1 | 7/2007 | Ellis-Monaghan et al. | |
| 2008/0131028 A1 | 6/2008 | Pillman et al. | |
| 2008/0151083 A1* | 6/2008 | Hains et al. | 348/273 |
| 2009/0040346 A1* | 2/2009 | Masuyama et al. | 348/294 |
| 2009/0316035 A1* | 12/2009 | Hirota | 348/311 |
| 2010/0128152 A1* | 5/2010 | Hayasaka et al. | 348/280 |
| 2011/0019041 A1 | 1/2011 | Ishiwata et al. | |
| 2011/0069189 A1* | 3/2011 | Venkataraman et al. | 348/218.1 |
| 2012/0025060 A1* | 2/2012 | Iwata | 250/208.1 |
| 2014/0009649 A1* | 1/2014 | Hayashi | 348/280 |
| 2014/0085504 A1* | 3/2014 | Hayashi | 348/223.1 |

FOREIGN PATENT DOCUMENTS

| | | |
|---|---|---|
| JP | 8-023543 A | 1/1996 |
| JP | 10-243407 A | 9/1998 |
| JP | 11-285012 A | 10/1999 |
| JP | 2000-308080 A | 11/2000 |
| JP | 2002-135793 A | 5/2002 |
| JP | 2004-221839 A | 8/2004 |
| JP | 2004-266369 A | 9/2004 |
| JP | 2005-136766 A | 5/2005 |
| JP | 2007-184904 A | 7/2007 |
| JP | 3960965 B2 | 8/2007 |
| JP | 2007-306490 A | 11/2007 |
| JP | 2008-078794 A | 4/2008 |
| JP | WO 2008/066898 A2 | 8/2008 |
| JP | 2008-236620 A | 10/2008 |
| JP | 2009-246465 A | 10/2009 |
| JP | 2010-512048 A | 4/2010 |
| JP | 2010-153511 A | 7/2010 |
| JP | 2011-523538 A | 8/2011 |
| WO | WO 02/056604 A1 | 7/2002 |
| WO | WO 2009/151903 A2 | 12/2009 |

OTHER PUBLICATIONS

Office Action issued in Chinese Patent Application No. 201180022503.3 on May 23, 2013.
Written Opinion of the ISA Issued in International Application No. PCT/JP2011/067544 on Sep. 6, 2012.
Written Opinion of the ISA issued in International Application Application No. PCT/JP2012/080898 on Jan. 22, 2013.
Written Opinion of the ISA Issued in International No. PCT/JP2012/080899 on Jan. 15, 2013.
Written Opinion of the ISA issued in International Application No. PCT/JP2012/081644 on Jan. 15, 2013.
Written Opinion of the ISA issued in International Application No. PCT/JP2012/083583 on Jan. 29, 2013.
Extended Search Report, dated Aug. 5, 2014, for counterpart EP Application No. 11860926.2.

* cited by examiner

FIG.3

TOTAL PIXELS [4896×3264] (3:2) — 40

| R | G | R | G | R | G | R | G | R | G | R | G |
|---|---|---|---|---|---|---|---|---|---|---|---|
| G | B | G | B | G | B | G | B | G | B | G | B |
| R | G | R | G | R | G | R | G | R | G | R | G |
| G | B | G | B | G | B | G | B | G | B | G | B |
| R | G | R | G | R | G | R | G | R | G | R | G |
| G | B | G | B | G | B | G | B | G | B | G | B |
| R | G | R | G | R | G | R | G | R | G | R | G |
| G | B | G | B | G | B | G | B | G | B | G | B |
| R | G | R | G | R | G | R | G | R | G | R | G |
| G | B | G | B | G | B | G | B | G | B | G | B |
| R | G | R | G | R | G | R | G | R | G | R | G |
| G | B | G | B | G | B | G | B | G | B | G | B |

FIG.7
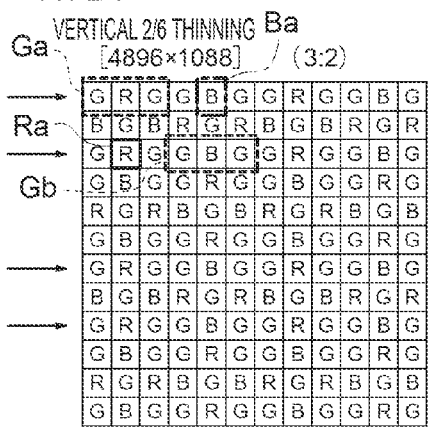
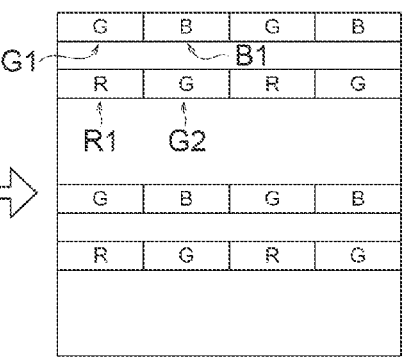
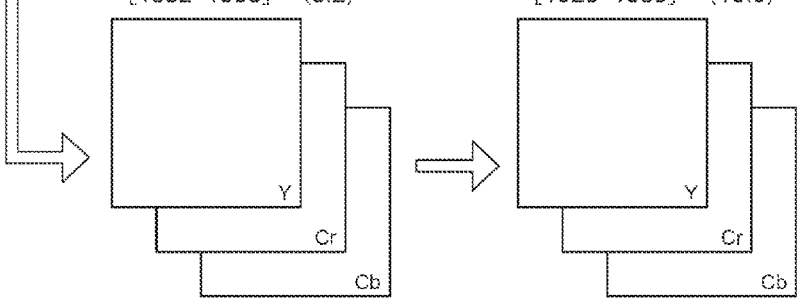

FIG.15
TYPE 3
VERTICAL 1/3 THINNING
[4896×1088]  (3:2)
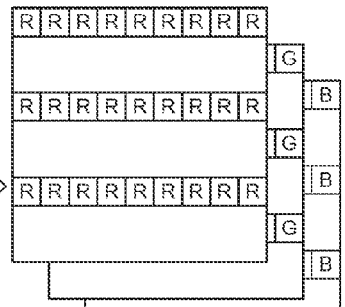
CONVERT TO RGB
[4896×1088×3]  (3:2)
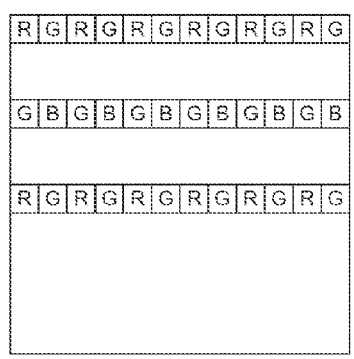
CONVERT TO BAYER ARRAY
[4896×1088]  (3:2)
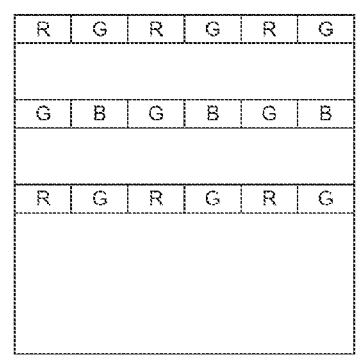
HORIZONTAL 2 PIXEL MIXING
[2448×1088]  (3:2)

IMAGING DEVICE AND STORAGE MEDIUM STORING AN IMAGING PROGRAM

CROSS-REFERENCE TO RELATED APPLICATIONS

This application is a continuation application of International Application No. PCT/JP2011/067544, filed Jul. 29, 2011, the disclosure of which is incorporated herein by reference in its entirety. Further, this application claims priority from Japanese Patent Application No. 2011-054631, filed Mar. 11, 2011, and Japanese Patent Application No. 2011-163306, filed Jul. 26, 2011.

BACKGROUND

1. Technical Field

The present invention relates to an imaging apparatus and an image capture program, and in particular to an imaging apparatus in which a single-chip color image pickup device is employed and to an image capture program of the same.

2. Related Art

Due to an output image of a single-chip color image pickup device being a RAW image (mosaic image), a multi-channel image is obtained by processing (synchronization processing) to interpolate missing color pixels from peripheral pixels. In such cases, sometimes there are problems with the reproduction characteristics of high frequency image signals. Due to aliasing being more liable to occur in captured images with a color image pickup device than with a black and white image pickup device, there is a need for higher resolution by increasing the reproducible region while suppressing moiré (false color) from occurring.

Patent Document 1 describes an imaging apparatus that performs thinning output with little generation of moiré and the like.

Moreover, Patent Document 2 describes an imaging apparatus that suppresses occurrence of moiré and lowers a color S/N ratio, and achieves higher resolution even with increased sensitivity by pixel mixing.

However, in a primary color type of Bayer array (see, for example, Patent Document 3 to Patent Document 5), that is the most widely employed color array in single-chip color image pickup devices, due to placing green (G) pixels, to which human eyes are most sensitive and that contribute most to obtaining a brightness signal, in a checkerboard pattern, with red (R) and blue (B) respectively placed in sequential lines, there are issues with reproduction precision when generating high frequency G signals in diagonal directions, and R, B signals in the horizontal direction and the vertical direction.

In order that such a problem does not occur, the use of color filters disposed with filters of each color in arrays other than Bayer arrays is contemplated (see, for example, Patent Document 6).

PATENT DOCUMENTS

Patent Document 1 Japanese Patent Application Laid-Open (JP-A) No. 2008-78794
Patent Document 2 JP-A No. 2009-246465
Patent Document 3 JP-A No. 2002-135793
Patent Document 4 Japanese Patent No. 3960965
Patent Document 5 JP-A No. 2004-266369
Patent Document 6 JP-A No. 11-285012

In such cases, image processing such as for example synchronization processing needs to be performed as image processing corresponding to a new color filter array. However there is the issue that changing image processing according to the new color filter array is extremely complicated and increases greatly the number of design steps.

SUMMARY

The present invention addresses the above issue, and an objective thereof is to provide an imaging apparatus and image capture program that enable an image processing section compatible with a Bayer array to be employed without modification even in cases in which an image pickup device is employed that is provided with a color filter of an array other than a Bayer array.

In order to address the above issue, an imaging apparatus of the present invention includes: an image pickup device including plural photoelectric conversion elements arrayed in a horizontal direction and a vertical direction; a color filter that is provided above plural pixels configured by the plural photoelectric conversion elements, the color filter having repeatedly disposed 6×6 pixel basic array patterns configured with a first array pattern and a second array pattern disposed symmetrically about a point, wherein the first array pattern has a first filter corresponding to a first color that contributes most to obtaining a brightness signal placed at the 4 corner and center pixels of a 3×3 pixel square array, a second filter corresponding to a second color different from the first color placed in a line at the horizontal direction center of the square array, and a third filter corresponding to a third color different from the first color and the second color placed in a line at the vertical direction center of the square array, and wherein the second array pattern has the same placement of the first filter as that in the first array pattern and has the placement of the second filter and the placement of the third filter swapped over to that of the first array pattern; a drive section that drives the image pickup device so as to read pixel data only of pixels on lines at predetermined positions in the vertical direction; a pixel conversion section that converts pixel data of each line thinned and read from the image pickup device into Bayer array pixel data that is in a Bayer array pattern in which two pixels placed on one diagonal of a 2×2 pixel square array are pixels of the first color, and two pixels placed on the other diagonal are a pixel of the second color and a pixel of the third color; and a generation section that, based on the Bayer array pixel data, generates pixel data for each color for each of the pixels by interpolating pixel data for colors other than the corresponding color from pixel data of peripheral pixels.

According to the invention, an image processing section compatible with a Bayer array can be employed without modification due to the configuration including the pixel conversion section that converts the pixel data of each line thinned and read from the image pickup device provided with the color filter configured by a repeatedly disposed 6×6 pixel basic array pattern that is not a Bayer array pattern into the Bayer array pixel data that is in a Bayer array pattern.

Note that configuration may be made wherein: the pixel conversion section converts pixel data of each line thinned and read from the image pickup device into the Bayer array pixel data by performing pixel mixing on pixel data of neighboring pixels of the same color in the horizontal direction to convert pixel data of each line thinned and read from the image pickup device.

Moreover, configuration may be made wherein: the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and the pixel conversion section converts pixel data of each line thinned and read from the image pickup device into the Bayer array pixel data by utilizing mixed pixel data of respectively neighboring pixel data of the first color in the first lines and in the third lines as each pixel of the first color at corresponding respective positions in the Bayer array pattern, utilizing pixel data of the third color in the first lines as each pixel of the third color at corresponding respective positions in the Bayer array pattern, and utilizing pixel data of the second color in the third lines as each pixel of the second color at corresponding respective positions in the Bayer array pattern.

Moreover, configuration may be made wherein: the drive section drives the image pickup device so as to thin and read pixel data only from pixels in the $(6n+2)^{th}$ (n=0, 1, 2, and so on) vertical direction second lines and the $(6n+5)^{th}$ (n=0, 1, 2, and so on) vertical direction fifth lines; and the pixel conversion section converts pixel data of each line thinned and read from the image pickup device into the Bayer array pixel data by utilizing respective pixel data of the first color in the second lines and in the fifth lines as each pixel of the first color at corresponding respective positions in the Bayer array pattern, utilizing mixed pixel data of neighboring pixel data of the second color in the second lines as each pixel of the second color at corresponding respective positions in the Bayer array pattern, and utilizing mixed pixel data of neighboring pixel data of the third color in the fifth lines as each pixel of the third color at corresponding respective positions in the Bayer array pattern.

Moreover, configuration may be made wherein: the drive section drives the image pickup device so as to thin and read pixel data only from pixels in the $(6n+1)^{th}$ (n=0, 1, 2, and so on) vertical direction first lines and the $(6n+4)^{th}$ (n=0, 1, 2, and so on) vertical direction fourth lines; and the pixel conversion section converts pixel data of each line thinned and read from the image pickup device into the Bayer array pixel data by utilizing mixed pixel data of respectively neighboring pixel data of the first color in the first lines and in the fourth lines as each pixel of the first color at corresponding respective positions in the Bayer array pattern, utilizing pixel data of the second color in the first lines as each pixel of the second color at corresponding respective positions in the Bayer array pattern, and utilizing mixed pixel data of neighboring pixel data of the third color in the fourth lines as each pixel of the third color at corresponding respective positions in the Bayer array pattern.

Moreover, configuration may be made wherein: the drive section drives the image pickup device so as to thin and read pixel data only from pixels in the $(12n+1)^{th}$ (n=0, 1, 2, and so on) vertical direction first lines and the $(12n+7)^{th}$ (n=0, 1, 2, and so on) vertical direction seventh lines; and the pixel conversion section converts pixel data of each line thinned and read from the image pickup device into the Bayer array pixel data by utilizing mixed pixel data of respectively neighboring pixel data of the first color in the first lines and in the seventh lines as each pixel of the first color at corresponding respective positions in the Bayer array pattern, utilizing pixel data of the second color in the vertical direction first lines as each pixel of the second color at corresponding respective positions in the Bayer array pattern, and utilizing pixel data of the third color in the seventh vertical direction lines as each pixel of the third color at corresponding respective positions in the Bayer array pattern.

Moreover, configuration may be made wherein: the drive section drives the image pickup device so as to thin and read pixel data only from pixels in the $(12n+2)^{th}$ (n=0, 1, 2, and so on) vertical direction second lines and the $(12n+8)^{th}$ (n=0, 1, 2, and so on) vertical direction eighth lines; and the pixel conversion section converts pixel data of each line thinned and read from the image pickup device into the Bayer array pixel data by utilizing respective pixel data of the first color in the second lines and in the eighth lines as each pixel of the first color at corresponding respective positions in the Bayer array pattern, utilizing mixed pixel data of neighboring pixel data of the second color in the vertical direction second lines as each pixel of the second color at corresponding respective positions in the Bayer array pattern, and utilizing mixed pixel data of neighboring pixel data of the third color in the vertical direction eighth lines as each pixel of the third color at corresponding respective positions in the Bayer array pattern.

Moreover, configuration may be made wherein: the drive section drives the image pickup device so as to thin and read pixel data only from pixels in the $(18n+2)^{th}$ (n=0, 1, 2, and so on) vertical direction second lines and the $(18n+11)^{th}$ (n=0, 1, 2, and so on) vertical direction eleventh lines; and the pixel conversion section converts pixel data of each line thinned and read from the image pickup device into the Bayer array pixel data by utilizing pixel data of the first color in the second lines and in the eleventh lines as each pixel of the first color at corresponding respective positions in the Bayer array pattern, utilizing mixed pixel data of neighboring pixel data of the third color in the vertical direction second lines as each pixel of the third color at corresponding respective positions in the Bayer array pattern, and utilizing pixel data of the second color in the vertical direction eleventh lines as each pixel of the second color at corresponding respective positions in the Bayer array pattern.

Moreover, configuration may be made wherein: for pixel data of each line thinned and read from the image pickup device, the pixel conversion section generates pixel data of the first color, the second color and the third color for each respective pixel position by performing summing of pixel data of pixels of the same color neighboring in the horizontal direction weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and the pixel conversion section generates pixel data of the first color, the second color and the third color for each respective pixel position by performing summing of pixel data of pixels of the same color respectively neighboring in the first lines and the third lines respectively weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(6n+2)^{th}$ (n=0, 1, 2, and so on) vertical direction second lines and the $(6n+5)^{th}$ (n=0, 1, 2, and so on) vertical direction fifth lines; and the pixel conversion section generates pixel data of the first color, the second color and the third color for each respective pixel position by performing summing of pixel data of pixels of the same color respectively neighboring in the second lines and the fifth lines respectively weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(6n+1)^{th}$ (n=0, 1, 2, and so on) vertical direction first lines and the $(6n+4)^{th}$ (n=0, 1, 2, and so on) vertical direction fourth lines; and the pixel conversion section generates pixel data of the first color, the second color and the third color for each respective pixel position by performing summing of pixel data of pixels of the same color respectively neighboring in the first lines and the fourth lines respectively weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(6n+1)^{th}$ (n=0, 1, 2, and so on) vertical direction first lines; and the pixel conversion section generates pixel data of the first color, the second color and the third color for each respective pixel position by performing summing of pixel data of pixels of the same color neighboring in the first lines weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(6n+2)^{th}$ (n=0, 1, 2, and so on) vertical direction second lines; and the pixel conversion section generates pixel data of the first color, the second color and the third color for each respective pixel position by performing summing of pixel data of pixels of the same color neighboring in the second lines weighted according to pixel position, and the pixel conversion section generates the Bayer array pixel data based on the generated pixel data of each color.

Moreover, configuration may be made wherein: the drive section drives the image pickup device so as to thin and read pixel data only from pixels in the $(9n+2)^{th}$ (n=0, 1, 2, and so on) vertical direction second lines; and the pixel conversion section generates pixel data of the first color, the second color and the third color for each respective pixel position by performing summing of pixel data of pixels of the same color neighboring in the second lines weighted according to pixel position, and the pixel conversion section generates the Bayer array pixel data based on the generated pixel data of each color.

Moreover, configuration may be made wherein: the pixel conversion section respectively generates 2 lines' worth of pixel data corresponding to the Bayer array pattern from pixel data of each line thinned and read from the image pickup device, and converts the generated two lines of pixel data into the Bayer array pixel data.

Moreover, configuration may be made wherein: the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and the pixel conversion section converts pixel data of each line thinned and read from the image pickup device into the Bayer array pixel data by utilizing mixed pixel data of 2 sets of respectively neighboring pixel data of the first color in the first lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing mixed pixel data of 2 sets of respectively neighboring pixel data of the first color in the third lines as each pixel of the first color at corresponding respective positions in $(2n+3)^{th}$ (n=0, 1, 2, and so on) vertical direction third Bayer array lines and in $(2n+4)^{th}$ (n=0, 1, 2, and so on) vertical direction fourth Bayer array lines of the Bayer array pattern, utilizing pixel data of the second color in the first lines and in the third lines as each pixel of the second color at corresponding respective positions in the first Bayer array lines and the third Bayer array lines of the Bayer array pattern, and utilizing pixel data of the third color in the first lines and in the third lines as each pixel of the third color at corresponding respective positions in the second Bayer array lines and the fourth Bayer array lines of the Bayer array pattern.

Moreover, configuration may be made wherein: the drive section drives the image pickup device so as to thin and read pixel data only from pixels in the $(6n+1)^{th}$ (n=0, 1, 2, and so on) vertical direction first lines; and the pixel conversion section converts pixel data of each line thinned and read from the image pickup device into the Bayer array pixel data by utilizing mixed pixel data of 2 sets of respectively neighboring pixel data of the first color in the first lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing pixel data of the second color in the first lines as each pixel of the second color at corresponding respective positions in the first Bayer array lines of the Bayer array pattern, and utilizing pixel data of the third color in the first lines as each pixel of the third color at corresponding respective positions in the second Bayer array lines of the Bayer array pattern.

Moreover, configuration may be made wherein: the drive section drives the image pickup device so as to thin and read pixel data only from pixels in the $(12n+2)^{th}$ (n=0, 1, 2, and so on) vertical direction second lines and the $(12n+8)^{th}$ (n=0, 1, 2, and so on) vertical direction eighth lines; and the pixel conversion section converts pixel data of each line thinned and read from the image pickup device into the Bayer array pixel data by utilizing 2 sets of pixel data of the first color in the second lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing pixel data of 2 sets of pixel data of the first color in the eighth lines as each pixel of the first color at corresponding respective positions in $(2n+3)^{th}$ (n=0, 1, 2, and so on) vertical direction third Bayer array lines and in $(2n+4)^{th}$ (n=0, 1, 2, and so on) vertical direction fourth Bayer array lines of the Bayer array pattern, utilizing mixed pixel data of neighboring pixel data of the second color in the second lines as each pixel of the second color at corresponding respective positions in the first Bayer array lines of the Bayer array pattern, utilizing mixed pixel data of neighboring pixel data of the second color in the eighth lines as each pixel of the second color at corresponding respective positions in the fourth Bayer array lines of the Bayer array pattern, utilizing mixed pixel data of neighboring pixel data of the third color in the second lines as each pixel of the third color at corresponding respective positions in the second Bayer array lines of the Bayer array pattern, and utilizing mixed pixel data of neighboring pixel data of the third color in the eighth lines as each pixel of the third color at corresponding respective positions in the third Bayer array lines of the Bayer array pattern.

Moreover, configuration may be made wherein the first color is green (G), the second color is one color of red (R) or blue (B), and the third color is the other color of red (R) or blue (B).

An image capture program of the present invention is an image capture program that causes a computer to function as a pixel conversion section configuring the imaging apparatus.

Advantageous Effects of Invention

According to the present invention, the advantageous effect is exhibited of enabling an image processing section compatible with a Bayer array to be employed without modification even in cases in which an image pickup device is employed that is provided with a color filter of an array other than a Bayer array.

BRIEF DESCRIPTION OF DRAWINGS

FIG. 3 is a configuration diagram of a Bayer array pattern color filter.

FIG. 7 is a diagram to explain a flow of pixel conversion processing according to a first exemplary embodiment.

FIG. 15 is a diagram to explain a flow of pixel conversion processing according to a ninth exemplary embodiment.

DESCRIPTION OF EMBODIMENTS

Explanation follows regarding exemplary embodiments of the present invention, with reference to the drawings.

First Exemplary Embodiment

Figure 1:
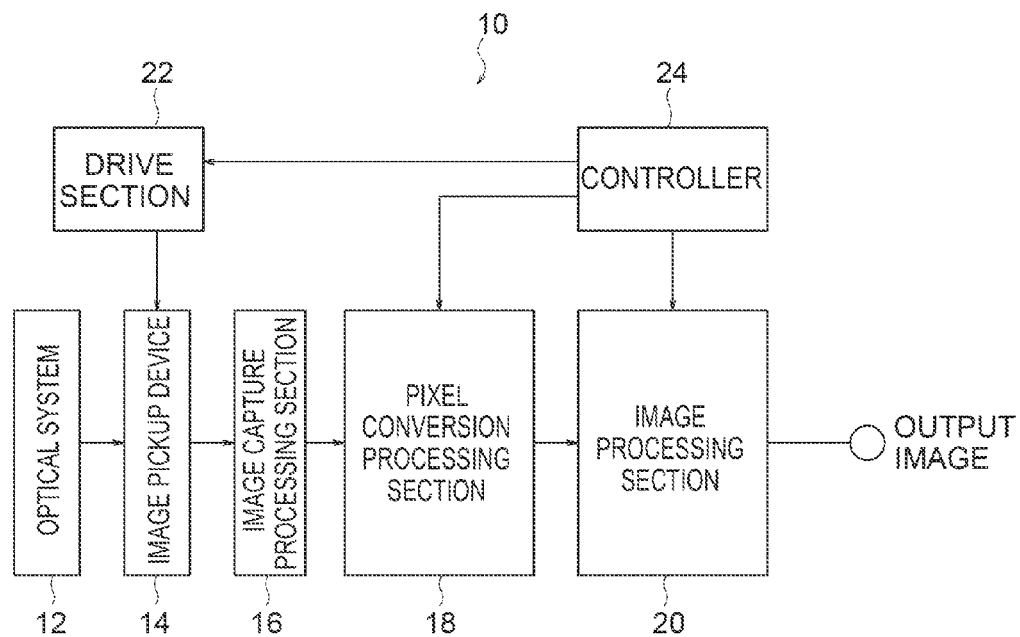
FIG. 1 is a schematic block diagram of an imaging apparatus.

FIG. 1 is a schematic block diagram illustrating an imaging apparatus 10 according to the present exemplary embodiment. The imaging apparatus 10 is configured including an optical system 12, an image pickup device 14, an image capture processing section 16, a pixel conversion processing section 18, an image processing section 20, a drive section 22, and a controller 24.

The optical system 12 is configured including for example a lens set configured from plural optical lenses, an aperture adjustment mechanism, a zoom mechanism, and an automatic focusing mechanism.

The image pickup device 14 is what is referred to as a 1-chip image pickup device configured by an image pickup device, such as for example a Charge Coupled Device (CCD) or a Complementary Metal Oxide Semiconductor (CMOS) containing plural photoelectric conversion elements arrayed in the horizontal direction and vertical direction, with a color filter disposed above the image pickup device.

Figure 2:
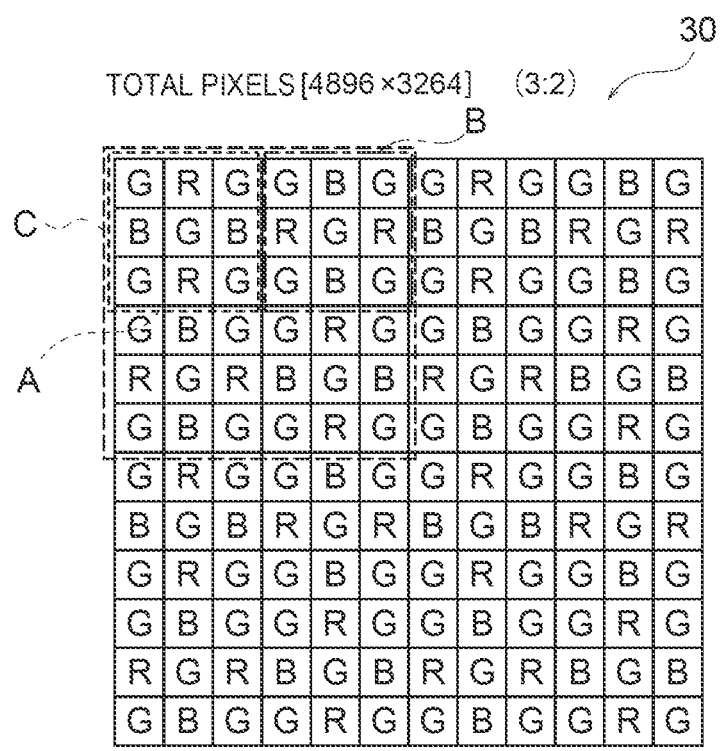
FIG. 2 is a configuration diagram of a color filter according to the present invention.

FIG. 2 illustrates a portion of a color filter 30 according to the present invention. Note that (4896×3264) pixels are provided as an example of the pixel number with an aspect ratio of 3:2, however there is no limitation to such a pixel number and aspect ratio. As illustrated in the drawing, the color filter 30 is a color filter having a repeatedly disposed 6×6 pixel basic array pattern C configured with a first array pattern A and a second array pattern B disposed symmetrically about a point, wherein the first array pattern A has a first filter G (referred to below as G filter) corresponding to G (green) that contributes most to obtaining a brightness signal placed at the 4 corner and center pixels of a 3×3 pixel square array, a second filter R (referred to below as R filter) corresponding to R (red) placed in the line at the horizontal direction center of the square array, and a third filter B (referred to below as B filter) corresponding to B (blue) placed in the line at the vertical direction center of the square array, and the second array pattern B has the same placement of the G filter as that of the first array pattern A and has the placement of the R filter and the placement of the B filter swapped over thereto.

Namely, the color filter 30 has the following features (1), (2), (3), (4) and (5).

Feature (1)

The color filter 30 illustrated in FIG. 2 includes the basic array pattern C formed from square array patterns corresponding to 6×6 pixels, with the basic array pattern C disposed so as to repeat in both the horizontal direction and the vertical direction. Namely, the color filter array is an array in which each of the filters R, G, B (the R filter, G filter, B filter) has a specific periodicity.

Arraying the R filter, G filter and B filter thus with such a specific periodicity, enables processing to be performed in a repeating pattern such as during synchronization (interpolation) processing of R, G, B signals read from the color image pickup device.

Moreover, when images are reduced by thinning processing in basic array pattern C units, the color filter array of the thinning processed reduced image can be made similar to the color filter array prior to thinning processing, enabling a common processing circuit to be employed.

Feature (2)

The color filter 30 illustrated in FIG. 2 has the G filter, that corresponds to the color contributing the most to obtaining a brightness signal (the color G in the present exemplary embodiment), placed in each line in the horizontal direction, vertical direction and diagonal directions of the color filter array.

The G filter corresponding to the brightness system pixels are placed in every line in the horizontal direction, vertical direction and diagonal directions of the color filter array, thereby enabling the reproduction precision of synchronization processing to be raised in the high frequency region, irrespective of the high frequency direction.

Feature (3)

In the color filter 30 illustrated in FIG. 2, the R filter and B filter, that correspond to the two or more other colors than the G color (the R and B colors in the present exemplary embodiment), are placed in each line in the horizontal direction and vertical direction of the color filter array.

The R filter and B filter are placed in each line in the horizontal direction and vertical direction of the color filter array, thereby enabling color moiré (false color) generation to be suppressed. Thus an optical low pass filter for suppressing false color generation may be omitted from placement on the optical path of the optical system from the incident face to the imaging plane. Moreover, even in cases in which an optical low pass filter is applied, one can be employed that has a weak action to cut the high frequency components to prevent false color generation, enabling deterioration of resolution to be avoided.

The basic array pattern C such as illustrated in FIG. 2 can be considered as an array of alternate first array pattern A and second array pattern B in the horizontal direction and vertical direction, wherein the first array pattern A is the 3×3 pixels surrounded by the frame of the broken line, and the second array pattern B is the 3×3 pixels surrounded by the frame of the single dot intermittent line.

The first array pattern A and the second array pattern B both have the G filters for the respective brightness system pixels placed at their 4 corners and center, so as to be placed along their two diagonals. Moreover, in the first array pattern A, the B filters are arrayed in the horizontal direction on each side of the central G filter, and the R filters are arrayed in the vertical direction. However, in the second array pattern B, the R filters are arrayed on each side of the central G filter in the horizontal direction, and the B filters are arrayed in the vertical direction. Namely, the first array pattern A and the second array pattern B have reverse positional relationships for the R filters and the B filters, but have the same placement otherwise.

Figure 22:
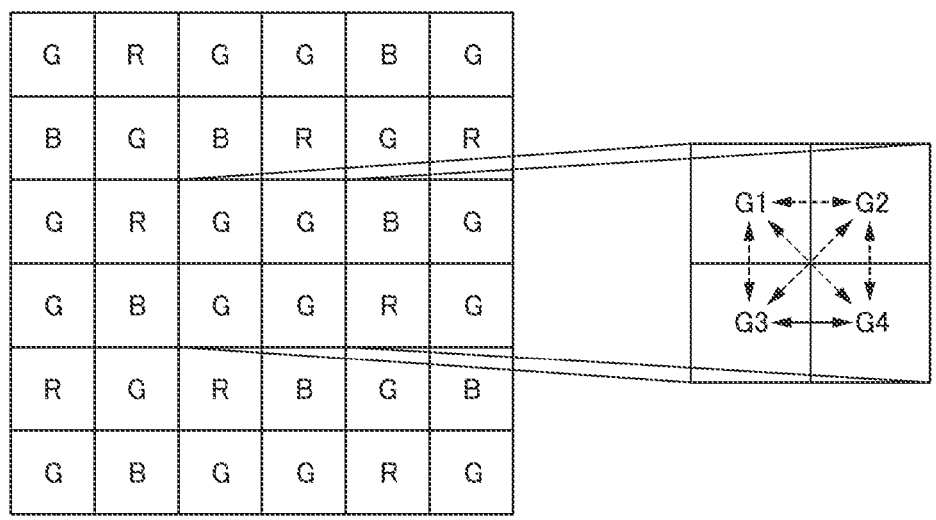
FIG. 22 is a diagram to explain a method of determining a correlation direction from pixel values of G pixels of 2×2 pixels contained in a color filter.

Moreover, the G filters at the 4 corners of the first array pattern A and the second array pattern B configure G filters that are arrayed in a square array corresponding to 2×2 pixels by disposing the first array pattern A and the second array pattern B alternately along the horizontal and vertical directions as illustrated in FIG. 22.

Feature (4)

The color filter 30 illustrated in FIG. 2 contains a square array corresponding to 2×2 pixels formed from the G filters.

As illustrated in FIG. 22, by extracting the 2×2 pixels formed from the G filters, and deriving the difference in absolute value of the pixel values of the G pixels in the horizontal direction, the difference in absolute value of the pixel values of the G pixels in the vertical direction, and the difference in absolute value of the pixel values of the G pixels in the diagonal directions (sloping up to the right and sloping up to the left), determination can be made that there is correlation in the direction with the smallest difference in absolute value out of the horizontal direction, vertical direction and diagonal directions.

Namely, according to the color filter array, the data of the G pixels with the smallest inter pixel separations are employed, thereby enabling determination of the direction with the highest correlation out of the horizontal direction, vertical direction and diagonal directions. The result of this directional determination can then be employed in interpolation processing from the peripheral pixels (synchronization processing).

Feature (5)

The basic array pattern C of the color filter 30 illustrated in FIG. 2 has point symmetry about the center of the basic array pattern C (the center of the 4 G filters). Moreover, as illustrated in FIG. 2, the first array pattern A and the second array pattern B inside the basic array pattern C also each have respective point symmetry about the G filters at their respective centers.

Such symmetry enables the circuit scale of a later stage processing circuit to be made smaller and to be simplified.

Figure 23:
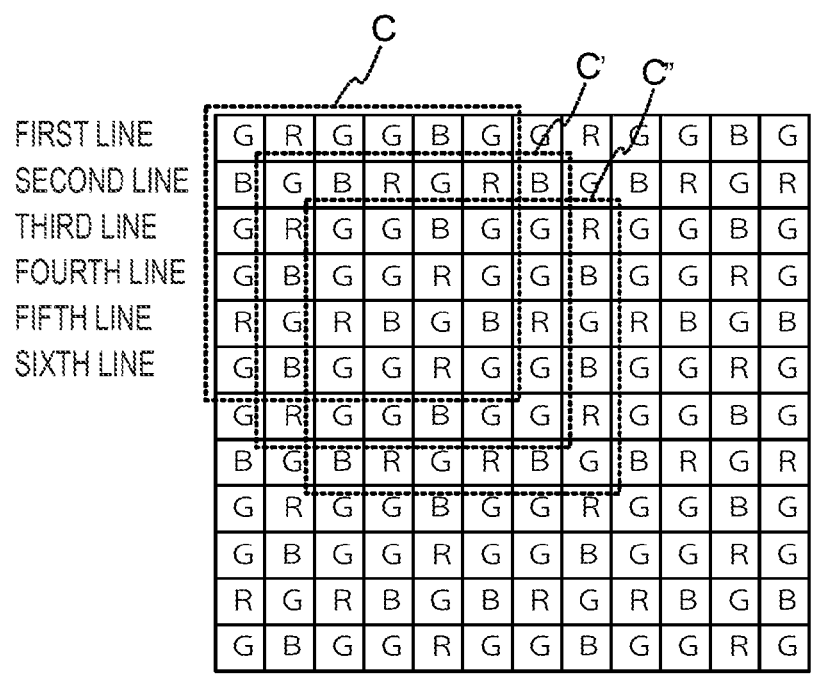
FIG. 23 is a diagram to explain principles of a basic array pattern contained in a color filter.

In the basic array pattern C as illustrated in FIG. 23, the color filter arrays of the first and third lines out of the first to sixth horizontal direction lines are GRGGBG, the color filter array of the second line is BGBRGR, the color filter arrays of the fourth and sixth lines are GBGGRG, and the color filter array of the fifth line is RGRBGB.

In FIG. 23, taking a shifted basic array pattern C' as the basic array pattern C shifted respectively by 1 pixel each in the horizontal direction and vertical direction, and a shifted basic array pattern C" shifted respectively by 2 pixels each, then the same color filter array results from repeatedly disposing the basic array pattern C', C" along the horizontal direction and vertical direction.

Namely, plural basic array patterns exist that enable configuration of the color filter array illustrated in FIG. 23 by repeatedly disposing basic array patterns in the horizontal direction and vertical direction. In the present exemplary embodiment, the basic array pattern C that is the basic array pattern with point symmetry is, for convenience, referred to as the basic array pattern.

Figure 24:
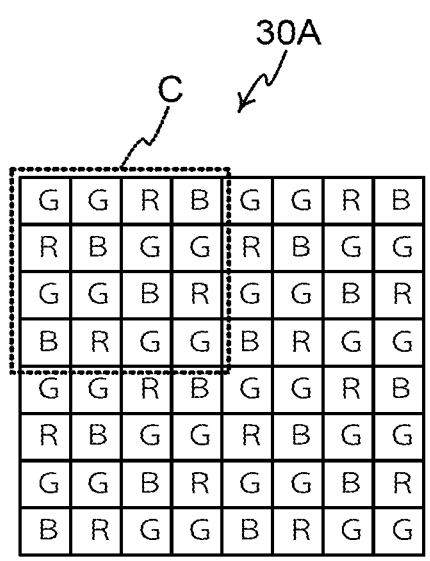
FIG. 24 is a diagram illustrating a modified example of a color filter.

FIG. 24 is a diagram illustrating a modified example of a color filter according to the present exemplary embodiment. A color filter 30A illustrated in FIG. 24 contains a basic array pattern C configured from square array patterns corresponding to 4×4 pixels, with the basic array pattern C disposed repeating in a horizontal direction and a vertical direction.

The color filter 30A, similarly to the color filter 30 illustrated in FIG. 2, has G filters placed in each line in the horizontal direction, vertical direction and diagonal directions of the color filter array, and with R filters and B filters placed in each line in the horizontal and vertical directions in the color filter array.

Moreover, the basic array pattern C has point symmetry about the center of the basic array pattern C.

However, although the color filter 30A does not include a square array corresponding to 2×2 pixels configured from G filters, the color filter 30A includes horizontal direction adjacent G filters and includes diagonal direction (bottom left to top right diagonal and top left to bottom right diagonal) adjacent G filters.

In the vertical direction, due to the presence of R filters or B filters interposed between G filters, the pixel values of the G pixels corresponding to these G filters can be employed when determining vertical direction correlation.

The color filter 30A described above has the same features as the features (1), (2), (3) and (5) of the color filter 30 illustrated in FIG. 2.

In contrast thereto, a section of a Bayer array color filter 40 is illustrated in FIG. 3. Note that the color filter illustrated in FIG. 3 is also an example in which the pixel number is (4896×3264) pixels, and the aspect ratio is 3:2. As illustrated in FIG. 3, the Bayer array color filter 40 is configured with G filters placed on 2 pixels on one of the diagonals of a square array of 2×2 pixels, and with an R filter and a B filter respectively placed on the 2 pixels of the other diagonal.

The image capture processing section 16 performs predetermined processing such as amplification processing, correlation double sampling processing and A/D conversion processing on image capture signals output from the image pickup device 14, and then outputs these as pixel data to the pixel conversion processing section 18. This pixel data is pixel data corresponding to the array of the color filter 30 illustrated in FIG. 2.

The pixel conversion processing section 18 is described in detail later, however briefly put, pixel data corresponding to the array of the color filter 30 illustrated in FIG. 2 output from the image capture processing section 16 is converted into pixel data corresponding to the Bayer array illustrated in FIG. 3.

The image processing section 20 subjects the pixel data corresponding to the Bayer array that has been output from the pixel conversion processing section 18 to what is referred to as synchronization processing. Namely, for all the pixels, interpolation is performed of pixel data for colors other than the corresponding respective color from pixel data of peripheral pixels, so as to generate R, G, B pixel data for all pixels. Then, what is referred to as YC conversion processing is performed to the generated R, G, B pixel data, to generate brightness data Y and color difference data Cr, Cb. Then resizing processing is performed to re-size these signals to a size according to the image capture mode.

The drive section 22 performs for example driving to read image capture signals from the image pickup device 14 according to instruction from the controller 24.

The controller 24 performs overall control of the drive section 22, the pixel conversion processing section 18, and the image processing section 20 according to the image capture mode. Although discussed in detail later, put briefly the controller 24 instructs the drive section 22 to read image capture signals with a reading method corresponding to the image capture mode, instructs the pixel conversion processing section 18 to perform pixel conversion processing corresponding to the image capture mode, and instructs the image processing section 20 to perform image processing corresponding to the image capture mode.

Since, depending on the image capture mode, there is a need to thin and read image capture signals from the image pickup device 14, the controller 24 instructs the drive section 22 so as to thin and read image capture signals using a thinning method corresponding to the instructed image capture mode.

In the present exemplary embodiment, explanation is given as examples of image capture modes of an example of processing in cases set with an HD video mode that thins a captured image and generates High Definition (HD) video data at a comparatively high resolution and records this on a recording medium such as a memory card, not illustrated in the drawings, and a through video mode in which a captured image is thinned and a through video of comparatively low resolution is output to a display section, not illustrated in the drawings.

First, explanation is given regarding processing in a case in which the image pickup device 14 employed is of a known configuration employing a Bayer array color filter, in a case of image capture with the HD video mode and the through video mode.

Figure 4:
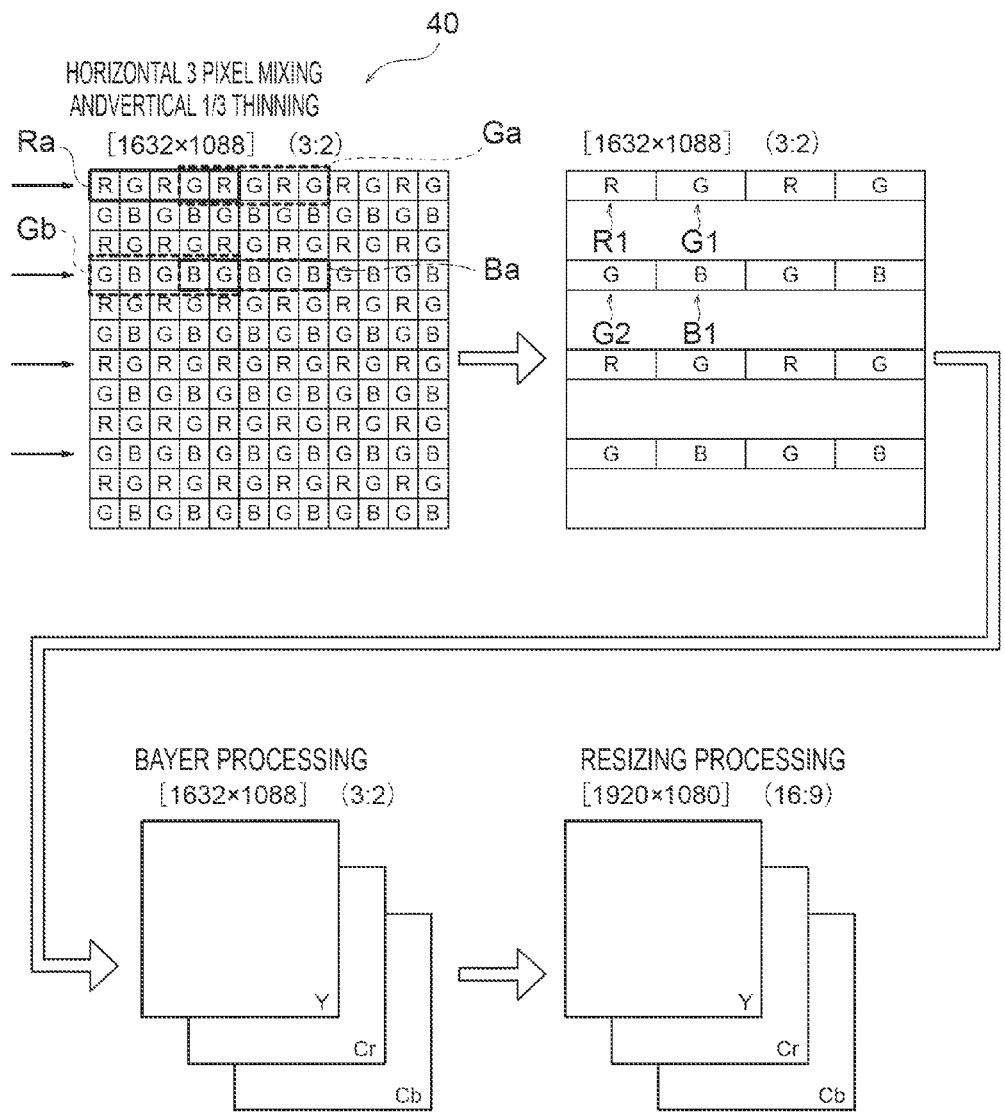
FIG. 4 is a diagram to explain a flow of processing in a case in which a Bayer array pattern color filter is employed.

FIG. 4 schematically illustrates a flow of processing in a case in which the image pickup device 14 employed is of a known configuration employing the Bayer array color filter 40 and image capture is performed in the HD video mode.

In such cases, as illustrated at the top left of FIG. 4, pixel data is thinned and read from every third vertical direction line. Namely, pixel data of the $(3n+1)^{th}$ (n=0, 1, 2, and so on) vertical direction lines is read (the lines indicated by the arrows in the drawing, thinned and read lines are similarly indicated by arrows hereafter). As illustrated at the top right of FIG. 4, due to performing pixel mixing of the pixel data of neighboring pixels of the same color in the horizontal direction, pixel data is generated for a pixel number (1632×1088) that is ⅓ the number pixels in both the horizontal direction and the vertical direction of the image pickup device 14.

Specifically, in the case of the R pixels, pixel mixing is performed (for example the average pixel value of the 3 individual R pixels is taken, similar applies below) for the 3 individual R pixels inside the frame Ra (containing 5 pixels) in the first line at the top left of FIG. 4 to give an R pixel R1 in the first line of the reduced image illustrated at the top right of FIG. 4. In the case of the G pixels, pixel mixing is performed for the 3 individual G pixels inside the frame Ga (containing 5 pixels) in the first line at the top left of FIG. 4 to give a G pixel G1 in the first line of the reduced image illustrated at the top right of FIG. 4, and pixel mixing is performed for the 3 individual G pixels inside the frame Gb (containing 5 pixels) illustrated in the fourth line at the top left of FIG. 4 to give a G pixel G2 in the second line of the reduced image illustrated at the top right of FIG. 4. In the case of the B pixels, pixel mixing is performed for the 3 individual B pixels inside the frame Ba (containing 5 pixels) in the fourth line at the top left of FIG. 4 to give a B pixel B1 in the second line of the reduced image illustrated at the top right of FIG. 4. By performing similar processing from thereon, pixel data is generated for a reduced Bayer array such as that illustrated at the top right of FIG. 4.

The synchronization processing and YC conversion processing (Bayer processing) described above are then performed on the pixel data illustrated at the top right of FIG. 4, generating brightness data Y and color difference data Cr, Cb as illustrated at the bottom left of FIG. 4. Then, as illustrated at the bottom right of FIG. 4, resizing processing is performed to re-size the brightness data Y and color difference data Cr, Cb to a size corresponding to the image capture mode. As an example, resizing is performed to a pixel number of (1920× 1080) with an aspect ratio of 16:9 at the bottom right of FIG. 4.

Figure 5:
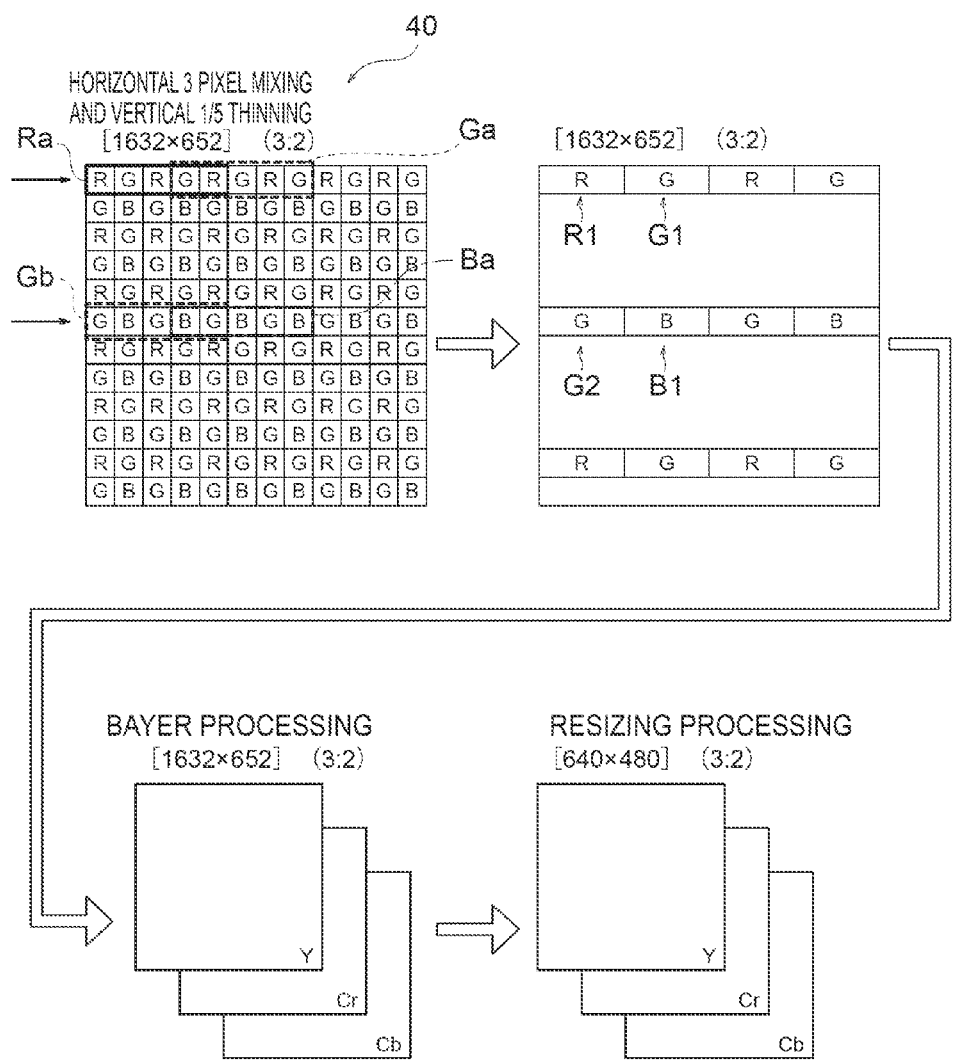
FIG. 5 is a diagram to explain a flow of processing in a case in which a Bayer array pattern color filter is employed.

FIG. 5 schematically illustrates a flow of processing in a case in which the image pickup device 14 of a known configuration employs the Bayer array color filter 40 and image capture is performed in the through video mode (live view mode).

In such cases, since a lower resolution suffices than in the HD video mode, data is thinned and read from every fifth vertical direction line, as illustrated at the top left of FIG. 5. Namely, pixel data is read from the $(5n+1)^{th}$ (n=0, 1, 2, and so on) vertical direction lines. Hereafter, processing is similar to that illustrated in FIG. 4, apart from the difference in the image size.

Note that since the Bayer processing illustrated at the bottom left of FIG. 4 and the bottom left of FIG. 5 is synchronization processing and YC conversion processing corresponding to a Bayer array, there is a need to modify the Bayer processing when employing the color filter 30 of an array differing from the Bayer array illustrated in FIG. 2.

However, the present exemplary embodiment is provided with the pixel conversion processing section 18. The pixel conversion processing section 18 converts pixel data corresponding to the array of the color filter 30 output from the image capture processing section 16 to pixel data corresponding to a Bayer array and outputs to the image processing section 20, such that there is no need to modify the image processing section 20.

Figure 6:
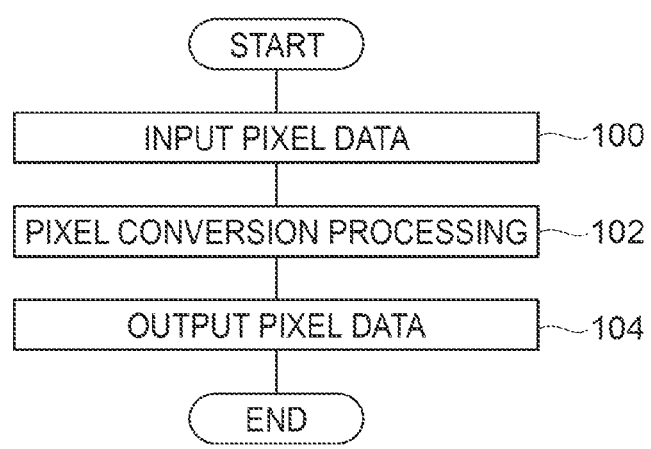
FIG. 6 is a flow chart of processing executed in a pixel conversion processing section.

Next, explanation follows regarding processing executed by the pixel conversion processing section 18 as operation of the present exemplary embodiment, with reference to the flow chart illustrated in FIG. 6.

Note that in the processing illustrated in FIG. 6 is executed in a case in which execution of pixel conversion processing has been instructed by the controller 24 according to the image capture mode.

On instruction to execute image capture for a specified image capture mode, the controller 24 instructs the drive section 22 to perform thin and read image capture signals with a thinning method corresponding to the image capture mode. The controller 24 moreover instructs the pixel conversion processing section 18 so as to perform pixel conversion processing corresponding to the image capture mode, and also instructs the image processing section 20 so as to perform Bayer processing (synchronization processing and YC conversion processing) and resizing processing corresponding to the image capture mode.

First, at step 100, pixel data is input from the image capture processing section 16. At step 102, pixel conversion processing is performed to convert the input pixel data to pixel data corresponding to a Bayer array. At step 104, the converted pixel data is output to the image processing section 20.

Note that the pixel conversion processing section 18 may be configured with a computer that includes for example a CPU, ROM, RAM and non-volatile ROM. In such cases a processing program for the above processing may, for example, be pre-stored on the non-volatile ROM, and then executed by reading into the CPU.

Explanation follows regarding a specific example of pixel conversion processing. In the present exemplary embodiment, explanation is given regarding a case in which, in the HD video mode, pixel data from each of the lines thinned and read from the image pickup device 14 is converted into Bayer array pixel data by performing pixel mixing of the pixel data of neighboring pixels of the same color in the horizontal direction for each of the lines thinned and read from the image pickup device 14.

FIG. 7 schematically illustrates a flow of processing in a case in which image capture is performed in the HD video mode. In the present exemplary embodiment, as illustrated at the top left of FIG. 7, the controller 24 instructs the drive section 22 so as to read pixel data from the $(6n+1)^{th}$ (n=0, 1, 2, and so on) vertical direction lines and the $(6n+3)^{th}$ (n=0, 1, 2, and so on) vertical direction lines. Accordingly pixel data is output only from the $(6n+1)^{th}$ and the $(6n+3)^{th}$ lines of the image pickup device 14. Namely, of the 6 vertical direction lines in the basic array pattern C, the second and the fourth to sixth lines are thinned out, and pixel data is read for the two lines of the first line and the third line. This is repeated for each of the basic array patterns.

In the pixel conversion processing section 18, pixel mixing is performed on the thinned and read pixel data of neighboring pixels of the same color in the horizontal direction, such that, as illustrated at the top right of FIG. 7, pixel data is generated for a pixel number of (1632×1088) that is ⅓ the pixel number of the image pickup device 14 in both the horizontal direction and the vertical direction.

Specifically, in the case of the G pixels, pixel mixing is performed (for example the average pixel value of the 2 individual G pixels is taken, similar applies below) for the 2 individual G pixels inside the frame Ga in the first line at the top left of FIG. 7 to give a G pixel G1 in the first line of the reduced image illustrated at the top right of FIG. 7, and pixel mixing is performed for the 2 individual G pixels inside the frame Gb in the third line to give a G pixel G2 in the second line of the reduced image illustrated at the top right of FIG. 7. In the case of the B pixels, the single B pixel inside the frame Ba in the first line illustrated at the top left of FIG. 7 gives a B pixel B1 in the first line of the reduced image illustrated at the top right of FIG. 7, and in the case of the R pixels, the single R pixel inside the frame Ra in the third line illustrated at the top left of FIG. 7 gives an R pixel R1 in the second line illustrated at the top right of FIG. 7. By performing similar processing from thereon, pixel data is generated for a reduced Bayer array, such as that illustrated at the top right of FIG. 7. Namely, each line of pixel data thinned and read from the image pickup device 14 is converted into Bayer array pixel data by utilizing the respective pixel mixed pixel data of the respectively neighboring G pixels in the $(6n+1)^{th}$ vertical direction lines and the $(6n+3)^{th}$ vertical direction lines direction as G pixels at corresponding respective positions in the Bayer array pattern, utilizing the pixel data of the B pixels in the $(6n+1)^{th}$ vertical direction lines as B pixels at corresponding respective positions in the Bayer array pattern, and utilizing the pixel data of the R pixels in the $(6n+3)^{th}$ vertical direction lines as R pixels at corresponding respective positions in the Bayer array pattern.

By employing the above thinning method, as illustrated at the top left of FIG. 7, the thinned and read pixel data predominantly contains G pixels, to which the human eye is sensitive, enabling an image with good sensitivity to be obtained.

Similarly to as illustrated in FIG. 4, after pixel conversion processing, Bayer processing (synchronization processing and YC conversion processing) and resizing processing is performed in the image processing section 20, and the resized image is output.

Second Exemplary Embodiment

Explanation follows regarding a second exemplary embodiment of the present invention. Note that portions similar to those of the above exemplary embodiment are allocated the same reference numerals and detailed explanation thereof is omitted.

The present exemplary embodiment differs from the first exemplary embodiment in the method of thinning image capture signals, and is otherwise similar to the first exemplary embodiment.

Figure 8:
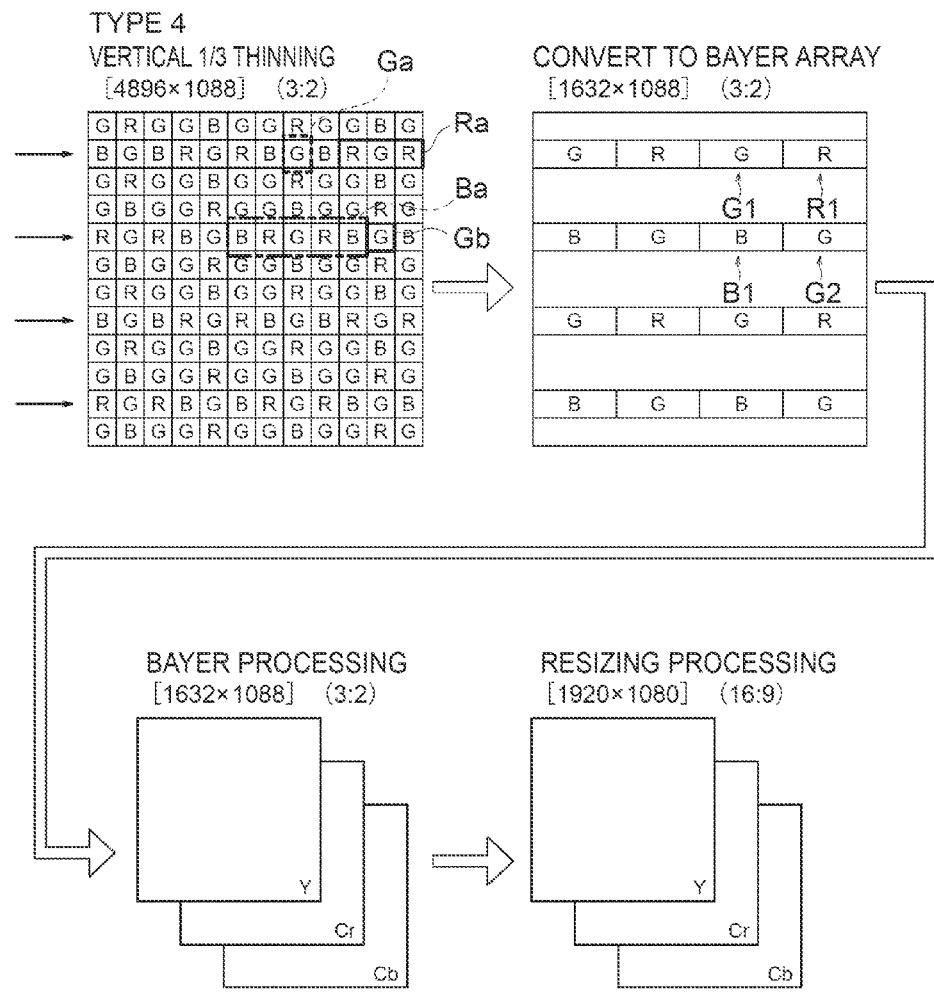
FIG. 8 is a diagram to explain a flow of pixel conversion processing according to a second exemplary embodiment.

FIG. 8 schematically illustrates a flow of processing in a case of image capture with the HD video mode. As illustrated at the top left of FIG. 8, in the present exemplary embodiment the controller 24 instructs the drive section 22 so as to read pixel data from the $(6n+2)^{th}$ (n=0, 1, 2, and so on) vertical direction lines and the $(6n+5)^{th}$ (n=0, 1, 2, and so on) vertical direction lines. Pixel data is accordingly output from the image pickup device 14 only for the $(6n+2)^{th}$ lines and the $(6n+5)^{th}$ lines. Namely, out of the 6 vertical direction lines of the basic array pattern C, the first, third, fourth and sixth lines are thinned out, and pixel data is read from the two lines of the second line and the fifth line. This is repeated for each of the basic array patterns.

In the pixel conversion processing section 18, pixel mixing is performed on the thinned and read pixel data of neighboring pixels of the same color in the horizontal direction. As illustrated at the top right of FIG. 8, pixel data is accordingly generated for a pixel number (1632×1088) that is ⅓ the pixel number in both the horizontal direction and the vertical direction of the image pickup device 14.

Specifically, in the case of the G pixels, the single pixel inside the frame Ga in the second line illustrated at the top left of FIG. 8 gives a G pixel G1 in the first line of the reduced image illustrated at the top right of FIG. 8, and the single pixel inside the frame Gb in the fifth line gives a G pixel G2 in the second line of the reduced image illustrated at the top right of FIG. 8. In the case of the R pixels, pixel mixed pixel data of the 2 individual R pixels inside the frame Ra in the second line illustrated at the top left of FIG. 8 gives an R pixel R1 in the first line of the reduced image illustrated at the top right of FIG. 8. In the case of the B pixels, pixel mixed pixel data of the 2 individual B pixels inside the frame Ba in the fifth line illustrated at the top left of FIG. 8 gives a B pixel B1 in the second line illustrated at the top right of FIG. 8. By performing similar processing from thereon, pixel data is generated for a reduced Bayer array, such as that illustrated at the top right of FIG. 8. Namely, each line of pixel data thinned and read from the image pickup device 14 is converted into Bayer array pixel data by respectively utilizing the G pixel data of the $(6n+2)^{th}$ vertical direction lines and the $(6n+5)^{th}$ vertical direction lines as G pixels at corresponding respective positions in the Bayer array pattern, utilizing the pixel mixed pixel data of the pixel data of the neighboring R pixels of the $(6n+2)^{th}$ vertical direction lines as R pixels at corresponding respective positions in the Bayer array pattern, and utilizing the pixel mixed pixel data of the pixel data of the neighboring B pixels of the $(6n+5)^{th}$ vertical direction lines as B pixels at corresponding respective positions in the Bayer array pattern.

In the above thinning method, as illustrated at the top left of FIG. 8, the thinned and read pixel data predominantly contains R pixels and B pixels, enabling an image to be obtained in which false color does not readily occur. Note that processing subsequent to the pixel conversion processing is similar to that of the above exemplary embodiment and so explanation thereof is omitted.

Third Exemplary Embodiment

Next, explanation follows regarding a third exemplary embodiment of the present invention. Note that portions similar to those of the above exemplary embodiments are allocated the same reference numerals, and detailed explanation thereof is omitted.

The present exemplary embodiment differs from the first exemplary embodiment in the method of thinning image capture signals, and is otherwise similar to the first exemplary embodiment.

Figure 9:
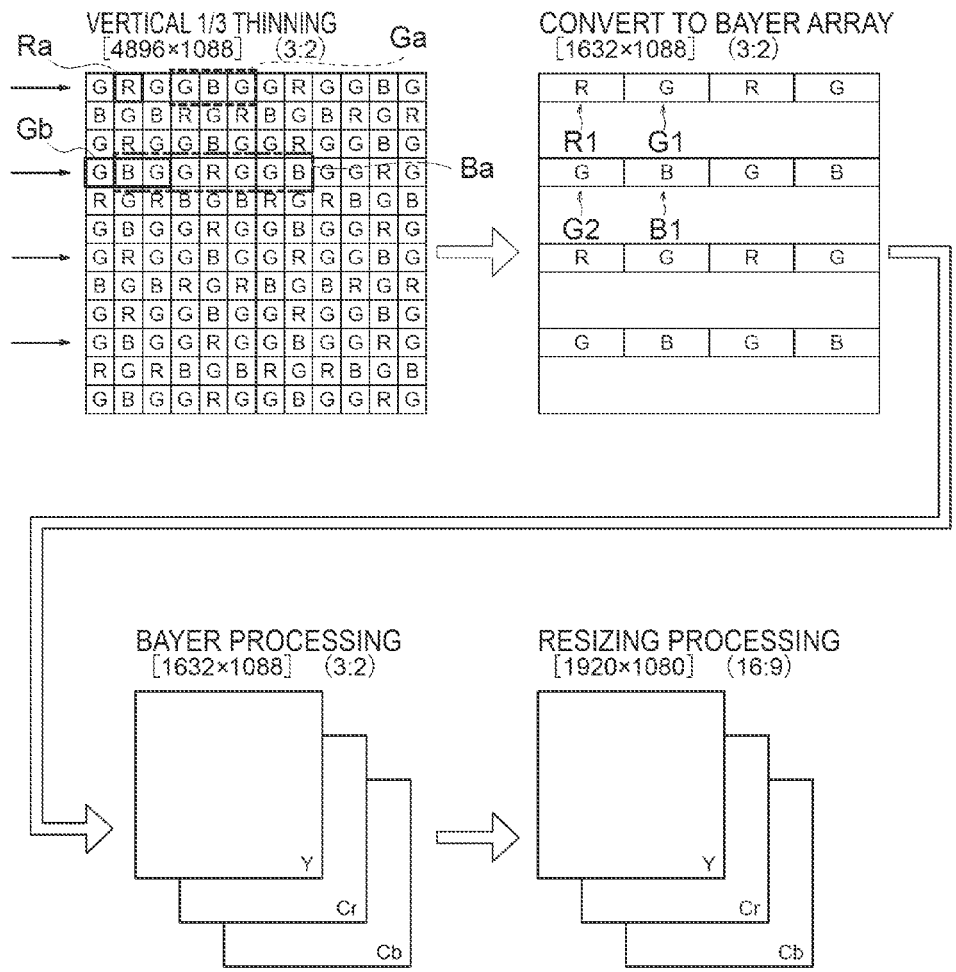
FIG. 9 is a diagram to explain a flow of pixel conversion processing according to a third exemplary embodiment.

FIG. 9 schematically illustrates a flow of processing in a case of image capture with the HD video mode. As illustrated at the top left of FIG. 9, in the present exemplary embodiment the controller 24 instructs the drive section 22 so as to read pixel data from the $(6n+1)^{th}$ (n=0, 1, 2, and so on) vertical direction lines and the $(6n+4)^{th}$ (n=0, 1, 2, and so on) vertical direction lines. Pixel data is accordingly output from the image pickup device 14 only for the $(6n+1)^{th}$ vertical direction lines and the $(6n+4)^{th}$ vertical direction lines. Namely, out of the 6 vertical direction lines of the basic array pattern C, the second, third, fifth and sixth lines are thinned out and pixel data is read for the two lines of the first line and the fourth line. This is repeated for each of the basic array patterns.

In the pixel conversion processing section 18, pixel mixing is performed on the thinned and read pixel data of neighboring pixels of the same color in the horizontal direction. As illustrated at the top right of FIG. 9, pixel data is accordingly generated for a pixel number (1632×1088) that is ⅓ the pixel number in both the horizontal direction and the vertical direction of the image pickup device 14.

Specifically, in the case of the G pixels, pixel mixed pixel data of the 2 individual G pixels inside the frame Ga in the first line illustrated at the top left of FIG. 9 gives a G pixel G1 in the first line of the reduced image illustrated at the top right of FIG. 9, and pixel mixed pixel data of the 2 individual G pixels inside the frame Gb in the fourth line gives a G pixel G2 in the second line of the reduced image illustrated at the top right of FIG. 9. In the case of the R pixels, the single R pixel inside the frame Ra in the first line illustrated at the top left of FIG. 9 gives an R pixel R1 in the first line of the reduced image illustrated at the top right of FIG. 9. In the case of the B pixels, pixel mixed pixel data of the 2 individual B pixels inside the frame Ba in the fourth line illustrated at the top left of FIG. 9 gives a B pixel B1 in the second line illustrated at the top right of FIG. 9. By performing similar processing from thereon, pixel data is generated for a reduced Bayer array, such as that illustrated at the top right of FIG. 9. Namely, each line of pixel data thinned and read from the image pickup device 14 is converted into Bayer array pixel data by respectively utilizing the pixel mixed pixel data of neighboring G pixels of the $(6n+1)^{th}$ vertical direction lines and the $(6n+4)^{th}$ vertical direction lines as G pixels at corresponding respective positions in the Bayer array pattern, utilizing the pixel data of the R pixel of the $(6n+1)^{th}$ vertical direction lines as R pixels at corresponding respective positions in the Bayer array pattern, and utilizing the pixel mixed pixel data of the pixel data of the neighboring B pixels of the $(6n+4)^{th}$ vertical direction lines as B pixels at corresponding respective positions in the Bayer array pattern.

In the above thinning method, as illustrated at the top left of FIG. 9, the thinned and read pixel data predominantly contains G pixels, and the R pixels and B pixels are in a checkerboard pattern, thereby enabling an image to be obtained that has fairly good sensitivity and in which false color occurs somewhat less readily.

Fourth Exemplary Embodiment

Explanation follows regarding a fourth exemplary embodiment of the present invention. Note that portions similar to those of the above exemplary embodiments are allocated the same reference numerals, and detailed explanation thereof is omitted.

The present exemplary embodiment differs from the first exemplary embodiment in the method of thinning image capture signals when the image capture mode is the through video mode (live view mode), and is otherwise similar to the first exemplary embodiment.

Figure 10:
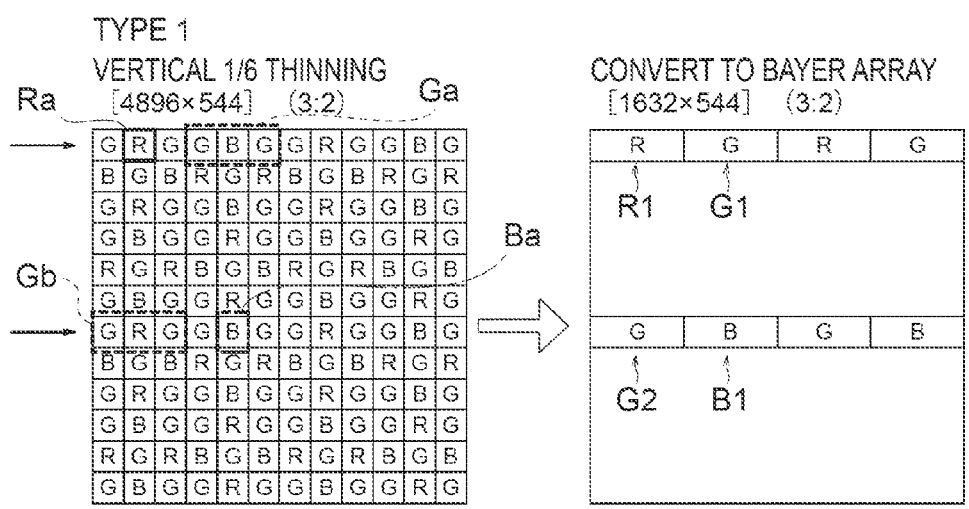
FIG. 10 is a diagram to explain a flow of pixel conversion processing according to a fourth exemplary embodiment.

FIG. 10 schematically illustrates a flow of processing in a case of image capture with the through video mode. Note that in FIG. 10, illustration of Bayer processing and resizing processing has been omitted (the same applies for subsequent exemplary embodiments).

As illustrated on the left of FIG. 10, in the present exemplary embodiment the controller 24 instructs the drive section 22 so as to read pixel data from the $(12n+1)^{th}$ (n=0, 1, 2, and so on) vertical direction lines and the $(12n+7)^{th}$ (n 0, 1, 2, and so on) vertical direction lines. Pixel data is accordingly output from the image pickup device 14 only for the $(12n+1)^{th}$ lines and the $(12n+7)^{th}$ lines. Namely, out of 12 vertical direction lines, thinning out of the second to sixth, and eighth to twelfth lines and reading of pixel data from the first line and the seventh line is performed repeatedly.

In the pixel conversion processing section 18, pixel mixing is performed on the thinned and read pixel data of neighboring pixels of the same color in the horizontal direction. As illustrated on the right of FIG. 10, pixel data is accordingly generated for a pixel number (1632×544) that is ⅓ the pixel number in the horizontal direction and is ⅙ the pixel number in the vertical direction.

Specifically, in the case of the G pixels, pixel mixed pixel data of the two individual G pixels inside the frame Ga in the first line illustrated on the left of FIG. 10 gives a G pixel G1 in the first line of the reduced image illustrated on the right of FIG. 10, and pixel mixed pixel data of the two individual G pixels inside the frame Gb in the seventh line gives a G pixel G2 in the second line of the reduced image illustrated on the right of FIG. 10. In the case of the R pixels, pixel data of the single R pixel inside the frame Ra in the first line illustrated on the left of FIG. 10 gives an R pixel R1 in the first line of the reduced image illustrated on the right of FIG. 10. In the case of the B pixels, pixel data of the single B pixel inside the frame Ba in the seventh line illustrated on the left of FIG. 10 gives a B pixel B1 in the second line illustrated on the right of FIG. 10. By performing similar processing from thereon, pixel data is generated for a reduced Bayer array, such as that illustrated on the right of FIG. 10. Namely, each line of pixel data thinned and read from the image pickup device 14 is converted into Bayer array pixel data by respectively utilizing the pixel mixed pixel data of the neighboring G pixels of the $(12n+1)^{th}$ vertical direction lines and the $(12n+7)^{th}$ vertical direction lines as G pixels at corresponding respective positions in the Bayer array pattern, utilizing the pixel data of the R pixels of the $(12n+1)^{th}$ vertical direction lines as R pixels at corresponding respective positions in the Bayer array pattern, and utilizing the pixel data of the B pixels of the $(12n+7)^{th}$ vertical direction lines as B pixels at corresponding respective positions in the Bayer array pattern.

Fifth Exemplary Embodiment

Explanation follows regarding a fifth exemplary embodiment of the present invention. Note that portions similar to those of the above exemplary embodiments are allocated the same reference numerals, and detailed explanation thereof is omitted.

The present exemplary embodiment differs from the fourth exemplary embodiment in the method of thinning image capture signals, and is otherwise similar to the fourth exemplary embodiment.

Figure 11:
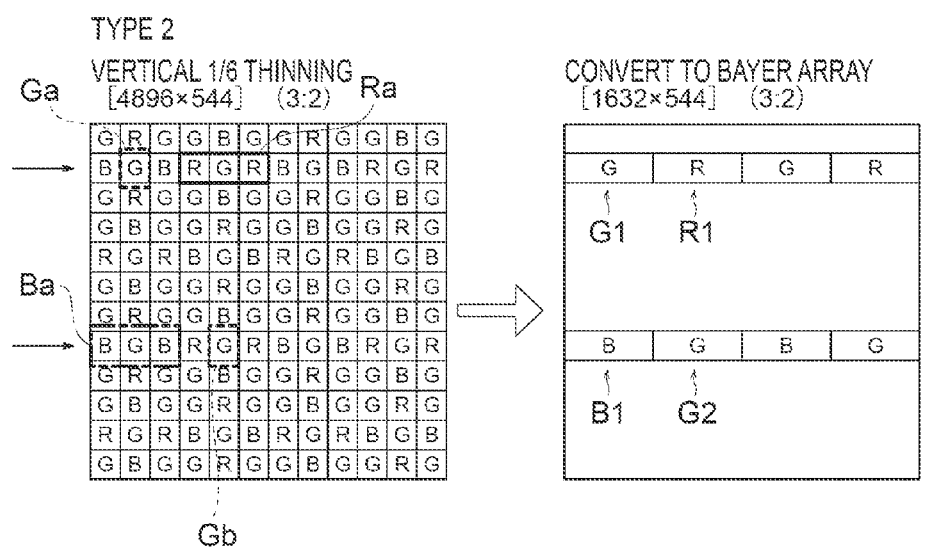
FIG. 11 is a diagram to explain a flow of pixel conversion processing according to a fifth exemplary embodiment.

FIG. 11 schematically illustrates a flow of processing in a case of image capture with the through video mode. As illustrated on the left of FIG. 11, in the present exemplary embodiment the controller 24 instructs the drive section 22 so as to read pixel data from the $(12n+2)^{th}$ (n=0, 1, 2, and so on) vertical direction lines and the $(12n+8)^{th}$ (n=0, 1, 2, and so on) vertical direction lines. Pixel data is accordingly output from the image pickup device 14 only for the $(12n+2)^{th}$ lines and the $(12n+8)^{th}$ lines. Namely, out of 12 vertical direction lines, thinning out of the first, third to seventh, ninth to twelfth lines and reading of pixel data from the second line and the eighth line is performed repeatedly.

In the pixel conversion processing section 18, pixel mixing is performed on the thinned and read pixel data of neighboring pixels of the same color in the horizontal direction. As illustrated on the right of FIG. 11, pixel data is accordingly generated for a pixel number (1632×544) that is ⅓ the pixel number in the horizontal direction and is ⅙ the pixel number in the vertical direction.

Specifically, in the case of the G pixels, pixel data of the single G pixel inside the frame Ga in the second line illustrated on the left of FIG. 11 gives a G pixel G1 in the first line of the reduced image illustrated on the right of FIG. 11, and pixel data of the single G pixel inside the frame Gb in the eighth line gives a G pixel G2 in the second line of the reduced image illustrated on the right of FIG. 11. In the case of the R pixels, pixel mixed pixel data of the 2 individual R pixels inside the frame Ra in the second line illustrated on the left of FIG. 11 gives an R pixel R1 in the first line of the reduced image illustrated on the right of FIG. 11. In the case of the B pixels, pixel mixed pixel data of the 2 individual B pixels inside the frame Ba in the eighth line illustrated on the left of FIG. 11 gives a B pixel B1 in the second line illustrated on the right of FIG. 11. By performing similar processing from thereon, pixel data is generated for a reduced Bayer array, such as that illustrated on the right of FIG. 11. Namely, each line of pixel data thinned and read from the image pickup device 14 is converted into Bayer array pixel data by respectively utilizing the pixel data of the G pixels of the $(12n+2)^{th}$ vertical direction lines and the $(12n+8)^{th}$ vertical direction lines as G pixels at corresponding respective positions in the Bayer array pattern, utilizing the pixel mixed pixel data of the neighboring R pixels of the $(12n+2)^{th}$ vertical direction lines as R pixels at corresponding respective positions in the Bayer array pattern, and utilizing the pixel mixed pixel data of the neighboring B pixels of the $(12n+8)^{th}$ vertical direction lines as B pixels at corresponding respective positions in the Bayer array pattern.

Sixth Exemplary Embodiment

Explanation follows regarding a sixth exemplary embodiment of the present invention. Note that portions similar to those of the above exemplary embodiments are allocated the same reference numerals, and detailed explanation thereof is omitted.

The present exemplary embodiment differs from the fourth exemplary embodiment in the method of thinning image capture signals, and is otherwise similar to the fourth exemplary embodiment.

Figure 12:
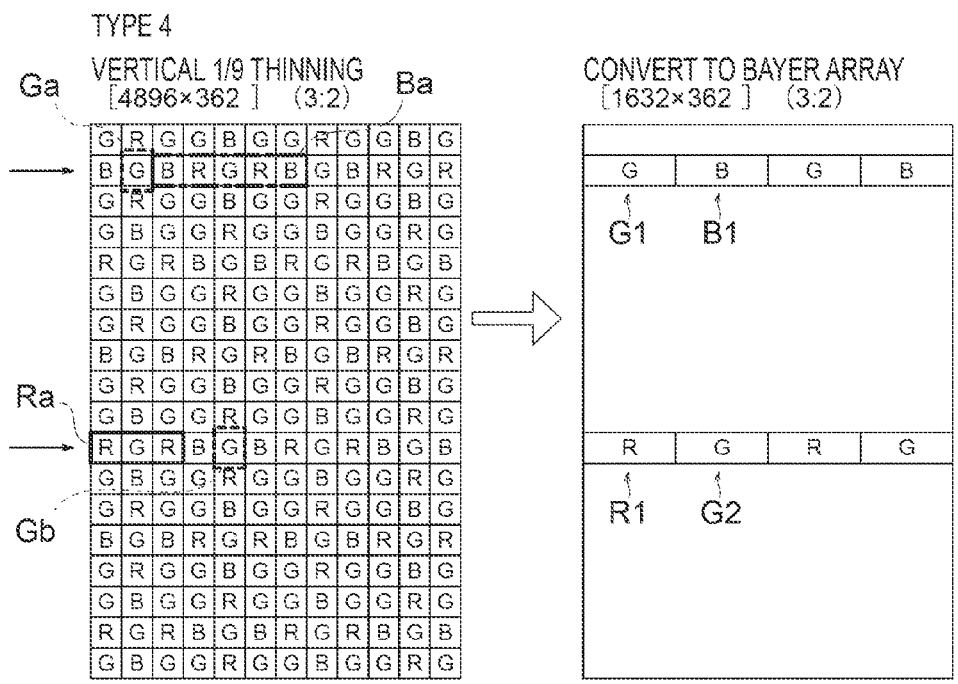
FIG. 12 is a diagram to explain a flow of pixel conversion processing according to a sixth exemplary embodiment.

FIG. 12 schematically illustrates a flow of processing in a case of image capture with the through video mode. As illustrated on the left of FIG. 12, in the present exemplary embodiment the controller 24 instructs the drive section 22 so as to read pixel data from the $(18n+2)^{th}$ (n=0, 1, 2, and so on) vertical direction lines and the $(18n+11)^{th}$ (n=0, 1, 2, and so on) vertical direction lines. Pixel data is accordingly output from the image pickup device 14 only for the $(18n+2)^{th}$ and the $(18n+11)^{th}$ lines. Namely, out of 18 vertical direction lines, thinning out of the first, third to tenth, and the twelfth to eighteenth lines and reading of pixel data from the second line and the eleventh line is performed repeatedly.

In the pixel conversion processing section 18, pixel mixing is performed on the thinned and read pixel data of neighboring pixels of the same color in the horizontal direction. As illustrated on the right of FIG. 12, pixel data is accordingly generated for a pixel number (1632×362) that is ⅓ the pixel number in the horizontal direction and is ⅑ the pixel number in the vertical direction.

Specifically, in the case of the G pixels, pixel data of the single G pixel inside the frame Ga in the second line illustrated on the left of FIG. 12 gives a G pixel G1 in the first line of the reduced image illustrated on the right of FIG. 12, and pixel data of the single G pixel inside the frame Gb in the eleventh line gives a G pixel G2 in the second line of the reduced image illustrated on the right of FIG. 12. In the case of the B pixels, pixel mixed pixel data of the 2 individual B pixels inside the frame Ba in the second line illustrated on the left of FIG. 12 gives a B pixel B1 in the first line of the reduced image illustrated on the right of FIG. 12. In the case of the R pixels, pixel mixed pixel data of the 2 individual R pixels inside the frame Ra in the eleventh line illustrated on the left of FIG. 12 gives an R pixel R1 in the second line illustrated on the right of FIG. 12. By performing similar processing from thereon, pixel data is generated for a reduced Bayer array, such as that illustrated on the right of FIG. 12. Namely, each line of pixel data thinned and read from the image pickup device 14 is converted into Bayer array pixel data by respectively utilizing the pixel data of the G pixels of the $(18n+2)^{th}$ lines and the $(18n+11)^{th}$ vertical direction lines as G pixels at corresponding respective positions in the Bayer array pattern, utilizing the pixel mixed pixel data of the neighboring B pixels of the $(18n+2)^{th}$ vertical direction lines as B pixels at corresponding respective positions in the Bayer array pattern, and utilizing the pixel mixed pixel data of the neighboring R pixels of the $(18n+11)^{th}$ vertical direction lines as R pixels at corresponding respective positions in the Bayer array pattern.

Seventh Exemplary Embodiment

Explanation follows regarding a seventh exemplary embodiment of the present invention. Note that portions similar to those of the above exemplary embodiments are allocated the same reference numerals, and detailed explanation thereof is omitted.

The present exemplary embodiment differs from the first exemplary embodiment in the pixel conversion processing, and is otherwise similar to the first exemplary embodiment. In the present exemplary embodiment, for the pixel data of each line thinned and read from the image pickup device 14, the pixel conversion processing section 18 generates R, G, B pixel data for each respective pixel position by performing summing of pixel data of pixels of the same color neighboring in the horizontal direction, weighted according to pixel position, and generates Bayer array pixel data based on the generated pixel data of each color.

Figure 13:
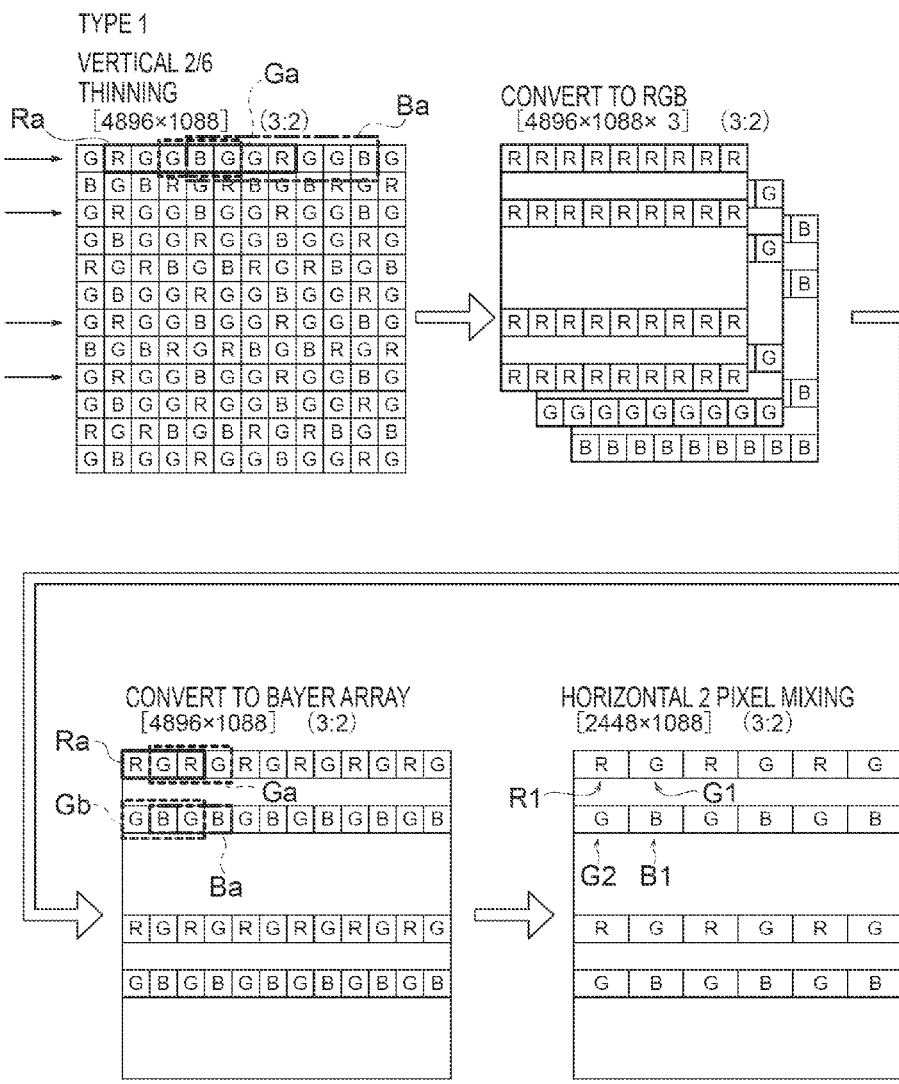
FIG. 13 is a diagram to explain a flow of pixel conversion processing according to a seventh exemplary embodiment.

FIG. 13 schematically illustrates a flow of processing in a case of image capture with the HD video mode. As illustrated on the top left of FIG. 13, in the present exemplary embodiment the controller 24 instructs the drive section 22 so as to read pixel data from the $(6n+1)^{th}$ (n=0, 1, 2, and so on) vertical direction lines and the $(6n+3)^{th}$ (n=0, 1, 2, and so on) vertical direction lines. Pixel data is accordingly output from the image pickup device 14 only for the $(6n+1)^{th}$ and the $(6n+3)^{th}$ lines.

In the pixel conversion processing section 18, summing is performed on each line of thinned and read pixel data from the image pickup device 14 for the pixel data of neighboring pixels of the same color in the horizontal direction, weighted according to pixel position, thereby generating R, G, B pixel data for each respective pixel position.

Specifically, for example in the case of the G pixels, G pixel data for each pixel position inside the frame Ga (containing 3 pixels) in the first line illustrated at the top left of FIG. 13 is generated by performing summing based on the pixel data of the 2 individual G pixels inside the frame Ga, weighted according to pixel position of the respective pixels inside the frame Ga. Although originally there is only a B pixel at the center pixel inside the frame Ga, G pixel data is interpolated therefor by the above weighted summing G pixel data is generated for every pixel position in the $(6n+1)^{th}$ lines and the $(6n+3)^{th}$ lines by performing similar processing whilst horizontal direction shifting the frame Ga along the $(6n+1)^{th}$ lines and the $(6n+3)^{th}$ lines. Similarly, in the cases of the R pixels and the B pixels, R pixel data and B pixel data is generated for every pixel position in the $(6n+1)^{th}$ lines and the $(6n+3)^{th}$ lines by performing the above weighted summing whilst horizontal direction shifting the frames Ra, Ba (both containing 7 pixels) illustrated at the top left of FIG. 13. R, G, B pixel data is accordingly generated for the $(6n+1)^{th}$ lines and the $(6n+3)^{th}$ lines as illustrated at the top right of FIG. 13.

Next, as illustrated at the bottom left of FIG. 13, the pixel conversion processing section 18 extracts pixel data for corresponding respective positions in the Bayer array pattern from the respective R, G, B pixel data generated as described above, thereby generating Bayer array pattern pixel data such as that illustrated at the bottom left of FIG. 13. Pixel mixing is then performed on horizontal direction neighboring pixels of the same color of the Bayer array pattern pixel data illustrated at the bottom left of FIG. 13, thereby generating Bayer array pattern pixel data for a horizontal direction pixel number half that of the pixel data illustrated at the bottom left of FIG. 13.

Specifically, in the case of the G pixels, the pixel mixed pixel data of the 2 individual G pixels inside the frame Ga in the first line illustrated at the bottom left of FIG. 13 gives a G pixel G1 in the first line of the reduced image illustrated at the bottom right of FIG. 13, and the pixel mixed pixel data of the 2 individual G pixels inside the frame Gb in the second line illustrated at the bottom left of FIG. 13 gives a G pixel G2 in the second line of the reduced image illustrated at the bottom right of FIG. 13. In the case of the R pixels, the pixel mixed pixel data of the 2 individual R pixels inside the frame Ra in the first line illustrated at the bottom left of FIG. 13 gives an R pixel R1 in the first line of the reduced image illustrated at the bottom right of FIG. 13. In the case of the B pixels, the pixel mixed pixel data of the 2 individual B pixels inside the frame Ba in the second line illustrated at the bottom left of FIG. 13 gives a B pixel B1 in the second line illustrated at the bottom right of FIG. 13. By performing similar processing from thereon, pixel data is generated for a reduced Bayer array, such as that illustrated at the bottom right of FIG. 13.

Eighth Exemplary Embodiment

Explanation follows regarding an eighth exemplary embodiment of the present invention. Note that portions similar to those of the above exemplary embodiments are allocated the same reference numerals, and detailed explanation thereof is omitted.

The present exemplary embodiment differs from the seventh exemplary embodiment in the method of thinning image capture signals, and is otherwise similar to the seventh exemplary embodiment.

Figure 14:
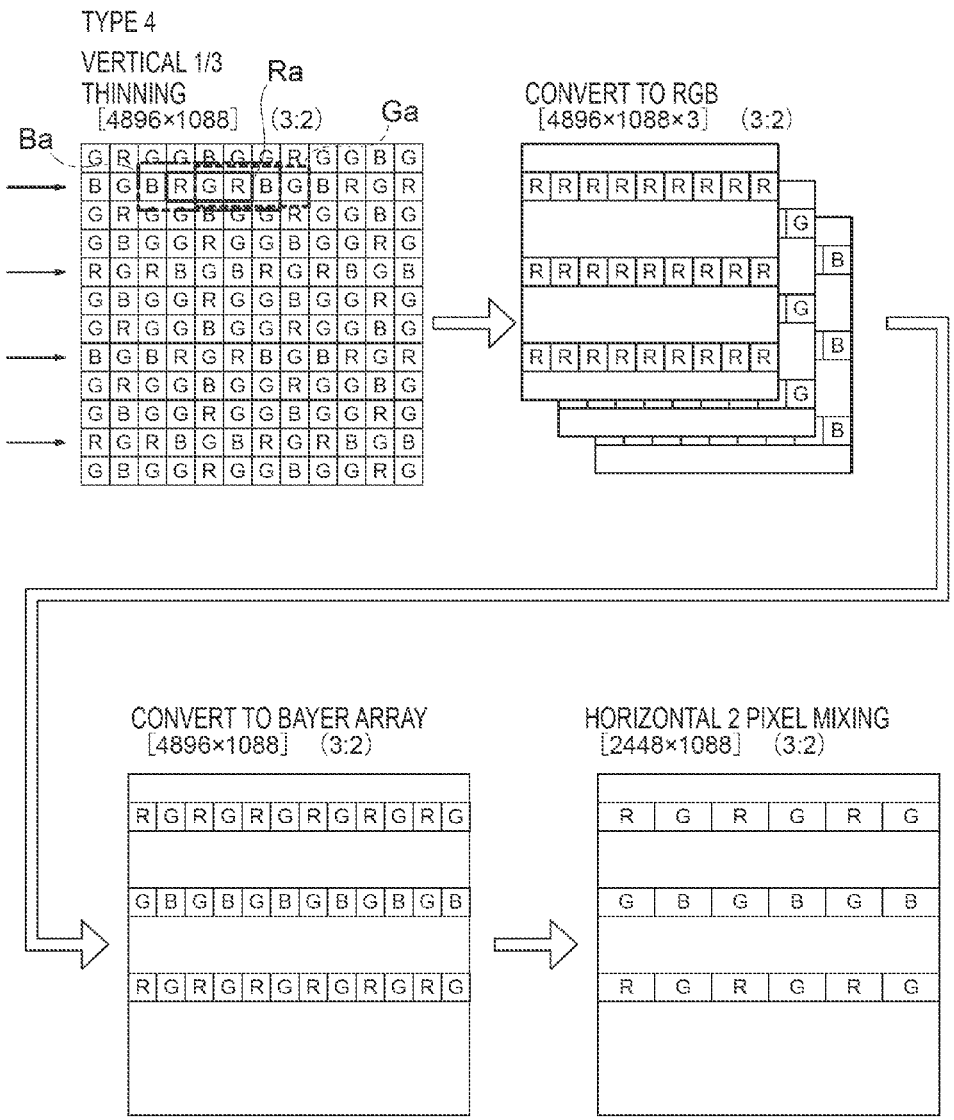
FIG. 14 is a diagram to explain a flow of pixel conversion processing according to an eighth exemplary embodiment.

FIG. 14 schematically illustrates a flow of processing in a case of image capture with the HD video mode. As illustrated on the top left of FIG. 14, in the present exemplary embodiment the controller 24 instructs the drive section 22 so as to read pixel data from the $(6n+2)^{th}$ (n=0, 1, 2, and so on) vertical direction lines and the $(6n+5)^{th}$ (n=0, 1, 2, and so on) vertical direction lines. Pixel data is accordingly output from the image pickup device 14 only for the $(6n+2)^{th}$ and the $(6n+5)^{th}$ lines. Processing thereafter is similar to that of the seventh exemplary embodiment.

Ninth Exemplary Embodiment

Explanation follows regarding a ninth exemplary embodiment of the present invention. Note that portions similar to those of the above exemplary embodiments are allocated the same reference numerals, and detailed explanation thereof is omitted.

The present exemplary embodiment differs from the seventh exemplary embodiment in the method of thinning image capture signals, and is otherwise similar to the seventh exemplary embodiment.

FIG. 15 schematically illustrates a flow of processing in a case of image capture with the HD video mode. As illustrated on the top left of FIG. 15, in the present exemplary embodiment the controller 24 instructs the drive section 22 so as to read pixel data from the $(6n+1)^{th}$ (n=0, 1, 2, and so on) vertical direction lines and the $(6n+4)^{th}$ (n=0, 1, 2, and so on) vertical direction lines. Pixel data is accordingly output from the image pickup device 14 only for the $(6n+1)^{th}$ and the $(6n+4)^{th}$ lines. Processing thereafter is similar to that of the seventh exemplary embodiment.

Tenth Exemplary Embodiment

Explanation follows regarding a tenth exemplary embodiment of the present invention. Note that portions similar to those of the above exemplary embodiments are allocated the same reference numerals, and detailed explanation thereof is omitted.

The present exemplary embodiment differs from the seventh exemplary embodiment in the image capture mode and the method of thinning image capture signals, and is otherwise similar to the seventh exemplary embodiment.

Figure 16:
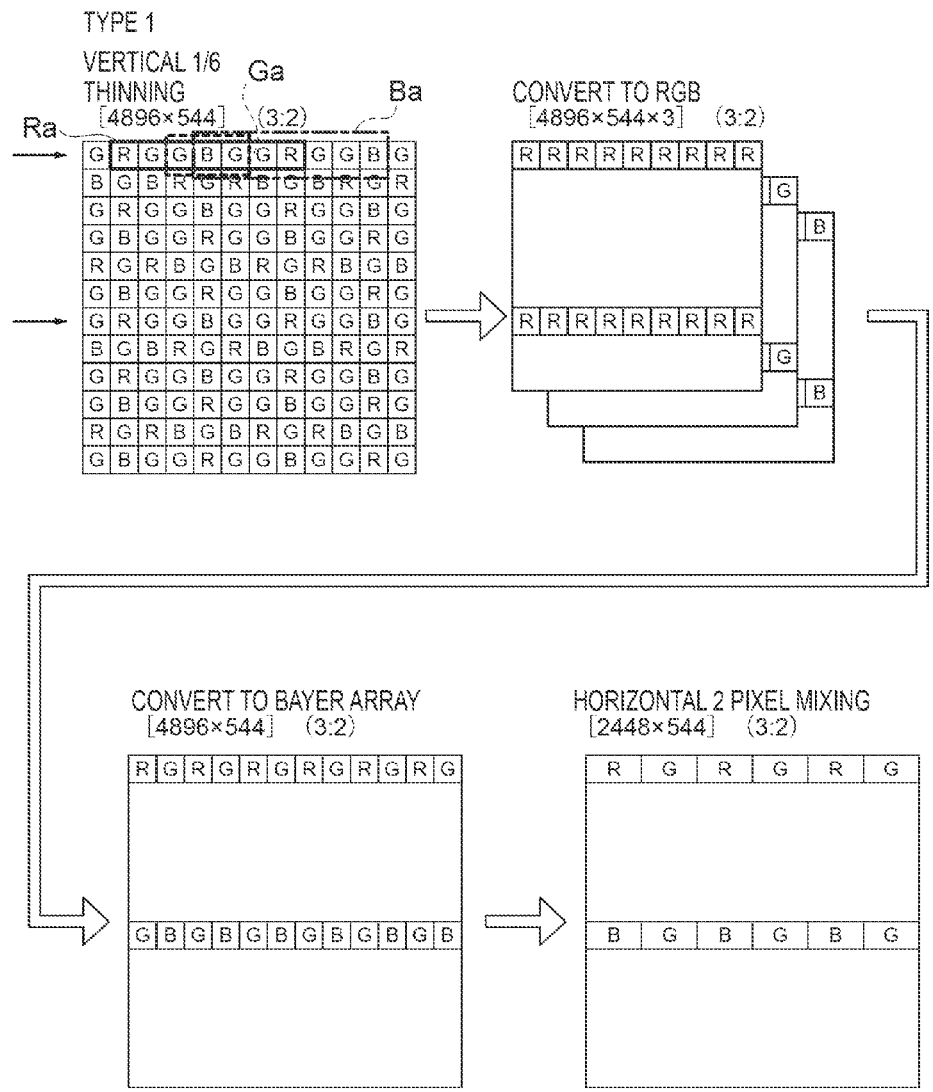
FIG. 16 is a diagram to explain a flow of pixel conversion processing according to a tenth exemplary embodiment.

FIG. 16 schematically illustrates a flow of processing in a case of image capture with the through video mode. As illustrated on the top left of FIG. 16, in the present exemplary embodiment the controller 24 instructs the drive section 22 so as to read pixel data from the $(6n+1)^{th}$ (n=0, 1, 2, and so on) vertical direction lines. Pixel data is accordingly output from the image pickup device 14 only for the $(6n+1)^{th}$ lines. Processing thereafter is similar to that of the seventh exemplary embodiment.

Eleventh Exemplary Embodiment

Explanation follows regarding an eleventh exemplary embodiment of the present invention. Note that portions similar to those of the above exemplary embodiments are allocated the same reference numerals, and detailed explanation thereof is omitted.

The present exemplary embodiment differs from the seventh exemplary embodiment in the image capture mode and the method of thinning image capture signals, and is otherwise similar to the seventh exemplary embodiment.

Figure 17:
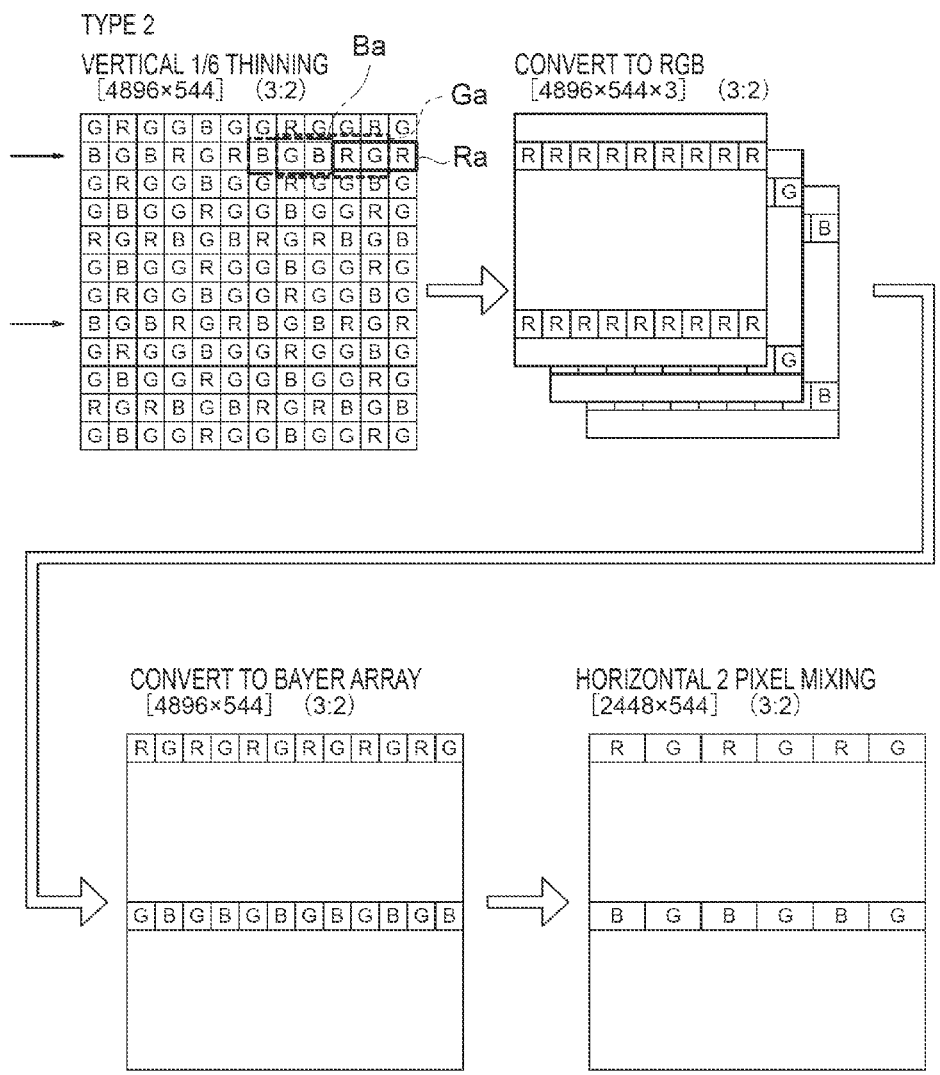
FIG. 17 is a diagram to explain a flow of pixel conversion processing according to an eleventh exemplary embodiment.

FIG. 17 schematically illustrates a flow of processing in a case of image capture with the through video mode. As illustrated on the top left of FIG. 17, in the present exemplary embodiment the controller 24 instructs the drive section 22 so as to read pixel data from the $(6n+2)^{th}$ (n=0, 1, 2, and so on) vertical direction lines. Pixel data is accordingly output from the image pickup device 14 only for the $(6n+2)^{th}$ lines. Processing thereafter is similar to that of the seventh exemplary embodiment.

Twelfth Exemplary Embodiment

Explanation follows regarding a twelfth exemplary embodiment of the present invention. Note that portions similar to those of the above exemplary embodiments are allocated the same reference numerals, and detailed explanation thereof is omitted.

The present exemplary embodiment differs from the seventh exemplary embodiment in the image capture mode and the method of thinning image capture signals, and is otherwise similar to the seventh exemplary embodiment.

Figure 18:
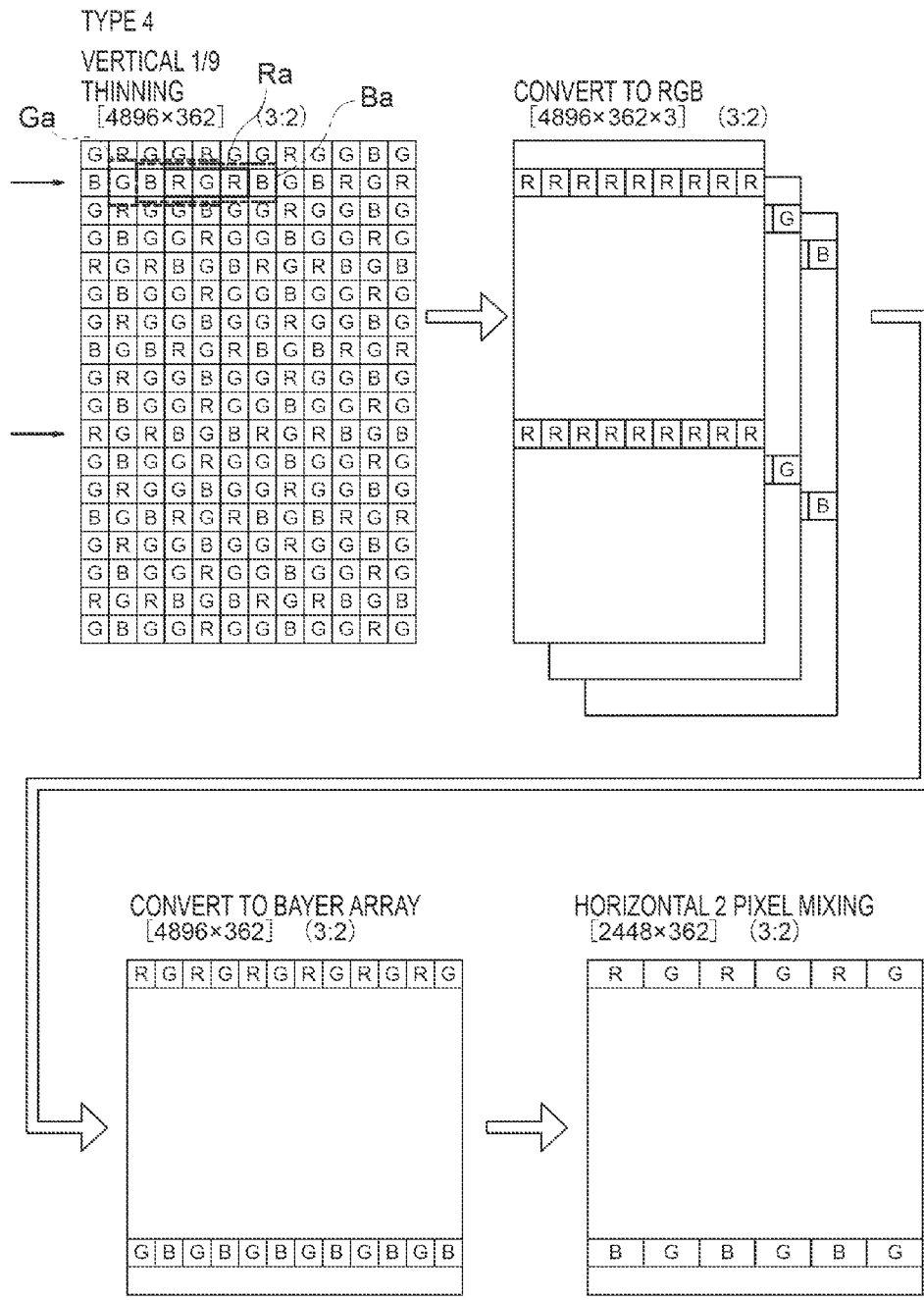
FIG. 18 is a diagram to explain a flow of pixel conversion processing according to a twelfth exemplary embodiment.

FIG. 18 schematically illustrates a flow of processing in a case of image capture with the through video mode. As illustrated on the top left of FIG. 18, in the present exemplary embodiment the controller 24 instructs the drive section 22 so as to read pixel data from the $(9n+2)^{th}$ (n=0, 1, 2, and so on) vertical direction lines. Pixel data is accordingly output from the image pickup device 14 only for the $(9n+2)^{th}$ lines. Processing thereafter is similar to that of the seventh exemplary embodiment.

Thirteenth Exemplary Embodiment

Explanation follows regarding a thirteenth exemplary embodiment of the present invention. Note that portions similar to those of the above exemplary embodiments are allocated the same reference numerals, and detailed explanation thereof is omitted.

The present exemplary embodiment differs from the first exemplary embodiment in the pixel conversion processing, and is otherwise similar to the first exemplary embodiment. In the present exemplary embodiment, the pixel conversion processing section 18 respectively generates 2 lines' worth of pixel data corresponding to a Bayer array pattern from the pixel data of each line thinned and read from the image pickup device 14, and converts the generated 2 lines of pixel data into Bayer array pixel data.

Figure 19:
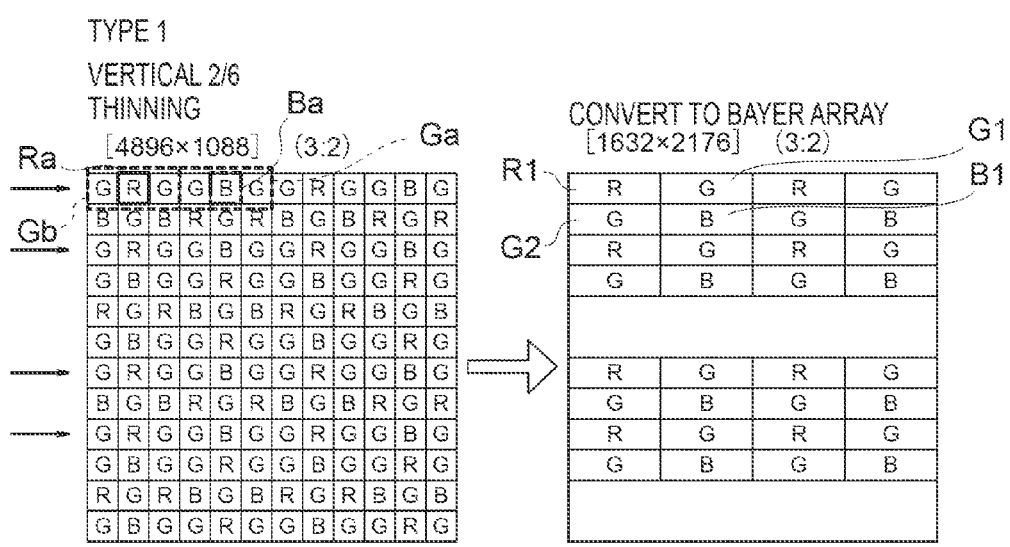
FIG. 19 is a diagram to explain a flow of pixel conversion processing according to a thirteenth exemplary embodiment.

FIG. 19 schematically illustrates a flow of processing in a case of image capture with the HD video mode. As illustrated on the left of FIG. 19, in the present exemplary embodiment the controller 24 instructs the drive section 22 so as to read pixel data from the $(6n+1)^{th}$ (n=0, 1, 2, and so on) vertical direction lines and the $(6n+3)^{th}$ (n=0, 1, 2, and so on) vertical direction lines. Pixel data is accordingly output from the image pickup device 14 only for the $(6n+1)^{th}$ and the $(6n+3)^{th}$ lines.

In the pixel conversion processing section 18, for example in the case of the G pixels in the first line illustrated on the left of FIG. 19, pixel mixed pixel data of the 2 individual G pixels inside the frame Ga (containing 3 pixels) gives a G pixel G1 in the first line of the reduced image illustrated on the right of FIG. 19, and pixel mixed pixel data of the 2 individual G pixels inside the frame Gb (containing 3 pixels) adjacent to the frame Ga on the left hand side gives a G pixel G2 in the second line of the reduced image illustrated on the right of FIG. 19. In the case of the R pixels, the single R pixel inside the frame Ra in the first line illustrated on the left of FIG. 19 gives an R pixel R1 in the first line of the reduced image on the right of FIG. 19. In the case of the B pixels, the single B pixel inside the frame Ba in the first line illustrated on the left of FIG. 19 gives a B pixel B1 in the second line illustrated on the right of FIG. 19. By performing similar processing from thereon to the pixel data of the $(6n+1)^{th}$ and the $(6n+3)^{th}$ lines, pixel data is generated for a reduced Bayer array such as that illustrated on the right of FIG. 19. Namely, each line of pixel data thinned and read from the image pickup device 14 is converted into Bayer array pixel data by respectively utilizing the pixel mixed pixel data of 2 sets of neighboring G pixels in the $(6n+1)^{th}$ vertical direction lines as G pixels at corresponding respective positions in the $(2n+1)^{th}$ vertical direction lines and $(2n+2)^{th}$ vertical direction lines in the Bayer array pattern, respectively utilizing the pixel mixed pixel data of 2 sets of neighboring G pixels in the $(6n+3)^{th}$ vertical direction lines as G pixels at corresponding respective positions in the $(2n+3)^{th}$ vertical direction lines and $(2n+4)^{th}$ vertical direction lines in the Bayer array pattern, respectively utilizing the pixel data of the R pixels in the $(6n+1)^{th}$ vertical direction lines and the $(6n+3)^{th}$ vertical direction lines as R pixels at corresponding respective positions in the $(2n+1)^{th}$ vertical direction lines and $(2n+3)^{th}$ vertical direction lines in the Bayer array pattern, and utilizing the pixel data of the B pixels in the $(6n+1)^{th}$ vertical direction and the $(6n+3)^{th}$ vertical direction lines as B pixels at corresponding respective positions in the $(2n+2)^{th}$ vertical direction lines and $(2n+4)^{th}$ vertical direction lines in the Bayer array pattern.

Fourteenth Exemplary Embodiment

Explanation follows regarding a fourteenth exemplary embodiment of the present invention. Note that portions similar to those of the above exemplary embodiments are allocated the same reference numerals, and detailed explanation thereof is omitted.

The present exemplary embodiment differs from the thirteenth exemplary embodiment in the image capture mode and the thinning processing, and is otherwise similar to the thirteenth exemplary embodiment.

Figure 20:
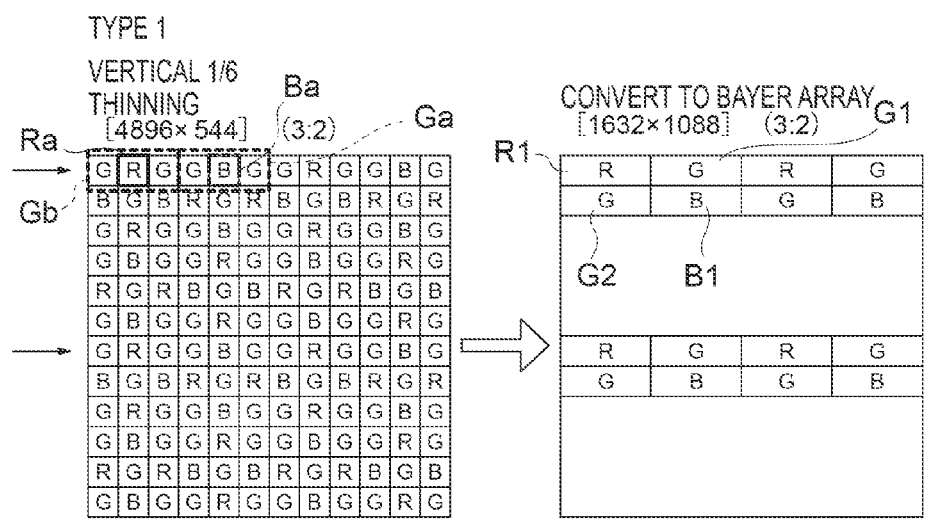
FIG. 20 is a diagram to explain a flow of pixel conversion processing according to a fourteenth exemplary embodiment.

FIG. 20 schematically illustrates a flow of processing in a case of image capture with the through video mode. As illustrated on the left of FIG. 20, in the present exemplary embodiment the controller 24 instructs the drive section 22 so as to read pixel data from the $(6n+1)^{th}$ (n=0, 1, 2, and so on) vertical direction lines. Pixel data is accordingly output from the image pickup device 14 only for the $(6n+1)^{th}$ lines.

In the pixel conversion processing section 18, for example in the case of the G pixels in the first line illustrated on the left of FIG. 20, pixel mixed pixel data of the 2 individual G pixels inside the frame Ga gives a G pixel G1 in the first line of the reduced image illustrated on the right of FIG. 20, and pixel mixed pixel data of the 2 individual G pixels inside the frame Gb gives a G pixel G2 in the second line of the reduced image illustrated on the right of FIG. 20. In the case of the R pixels, the single R pixel inside the frame Ra in the first line illustrated on the left of FIG. 20 gives an R pixel R1 in the first line of the reduced image illustrated on the right of FIG. 20. In the case of the B pixels, the single B pixel inside the frame Ba in the first line illustrated on the left of FIG. 20 gives a B pixel B1 in the second line illustrated on the right of FIG. 20. By performing similar processing from thereon to the pixel data of the $(6n+1)^{th}$ lines, pixel data is generated for a reduced Bayer array such as that illustrated on the right of FIG. 20. Namely, each line of pixel data thinned and read from the image pickup device 14 is converted into Bayer array pixel data by respectively utilizing the pixel mixed pixel data of 2 sets of neighboring G pixels in the $(6n+1)^{th}$ vertical direction lines as G pixels at corresponding respective positions in the $(2n+1)^{th}$ vertical direction lines and $(2n+2)^{th}$ vertical direction lines in the Bayer array pattern, utilizing the pixel data of the R pixels in the $(6n+1)^{th}$ vertical direction lines as R pixels at corresponding respective positions in the $(2n+1)^{th}$ vertical direction lines in the Bayer array pattern, and utilizing the pixel data of the B pixels in the $(6n+1)^{th}$ vertical direction lines as B pixels at corresponding respective positions in the $(2n+2)^{th}$ vertical direction lines in the Bayer array pattern.

Fifteenth Exemplary Embodiment

Explanation follows regarding a fifteenth exemplary embodiment of the present invention. Note that portions similar to those of the above exemplary embodiments are allocated the same reference numerals, and detailed explanation thereof is omitted.

The present exemplary embodiment differs from the thirteenth exemplary embodiment in the image capture mode and the thinning processing, and is otherwise similar to the thirteenth exemplary embodiment.

Figure 21:
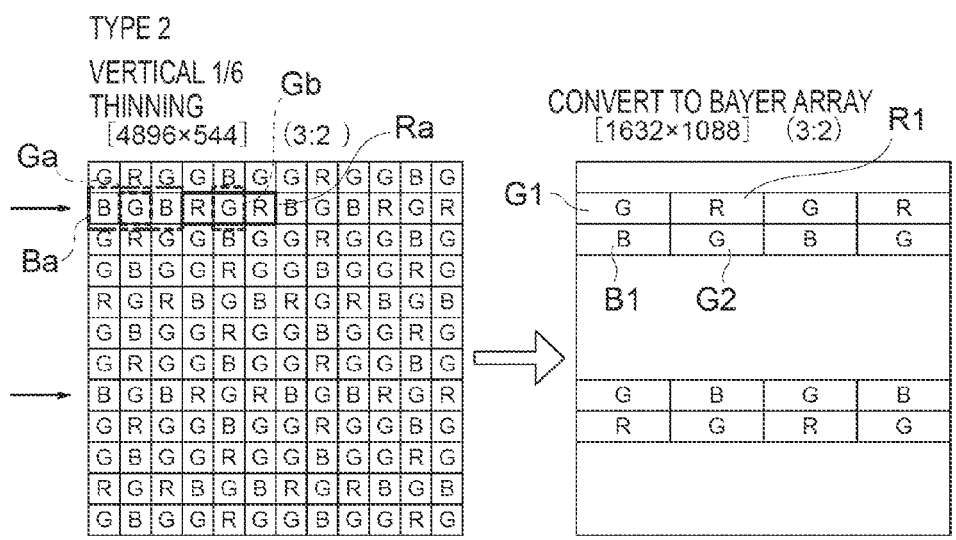
FIG. 21 is a diagram to explain a flow of pixel conversion processing according to a fifteenth exemplary embodiment.

FIG. 21 schematically illustrates a flow of processing in a case of image capture with the through video mode. As illustrated on the left of FIG. 21, in the present exemplary embodiment the controller 24 instructs the drive section 22 so as to read pixel data from the $(12n+2)^{th}$ (n=0, 1, 2, and so on) vertical direction lines and the $(12n+8)^{th}$ (n=0, 1, 2, and so on) vertical direction lines. Pixel data is accordingly output from the image pickup device 14 only for the $(12n+2)^{th}$ and the $(12n+8)^{th}$ lines.

In the pixel conversion processing section 18, for example in the case of the G pixels in the second line illustrated on the left of FIG. 21, the pixel data of the single pixel inside the frame Ga gives a G pixel G1 in the first line of the reduced image illustrated on the right of FIG. 21, and the pixel data of the single pixel inside the frame Gb gives a G pixel G2 in the second line of the reduced image illustrated on the right of FIG. 21. In the case of the R pixels, pixel mixed pixel data of the 2 individual R pixels inside the frame Ra in the second line illustrated on the left of FIG. 21 gives an R pixel R1 in the first line of the reduced image illustrated on the right of FIG. 21, and in the case of the B pixels, pixel mixed pixel data of the 2 individual B pixels inside the frame Ba in the second line illustrated on the left of FIG. 21 gives a B pixel B1 in the second line illustrated on the right of FIG. 21. Similar processing is performed from thereon to the pixel data of the $(12n+2)^{th}$ lines and $(12n+8)^{th}$ lines. Note that the positions of the R pixels and the B pixels are reversed in the Bayer array image generated from the $(12n+8)^{th}$ lines, as illustrated on the right of FIG. 21. Due to performing such processing, pixel data is generated for a reduced Bayer array such as that illustrated on the right of FIG. 21. Namely, each line of pixel data thinned and read from the image pickup device 14 is converted into Bayer array pixel data by respectively utilizing the pair of 2 G pixels in the $(12n+2)^{th}$ vertical direction lines as G pixels at corresponding respective positions in the $(2n+1)^{th}$ lines and $(2n+2)^{th}$ lines in the Bayer array pattern vertical direction, utilizing the pixel mixed pixel data of the neighboring R pixels in the $(12n+2)^{th}$ lines as R pixels at corresponding respective positions in the $(2n+1)^{th}$ lines in the Bayer array pattern, utilizing the pixel mixed pixel data of the neighboring R pixels in the $(12n+8)^{th}$ lines as R pixels at corresponding respective positions in the $(2n+4)^{th}$ lines in the Bayer array pattern, utilizing the pixel mixed pixel data of the neighboring B pixels in the $(12n+2)^{th}$ lines as B pixels at corresponding respective positions in the $(2n+2)^{th}$ lines in the Bayer array pattern, and utilizing the pixel mixed pixel data of the neighboring B pixels in the $(12n+8)^{th}$ lines as B pixels at corresponding respective positions in the $(2n+3)^{th}$ lines in the Bayer array pattern.

Note that in each of the above exemplary embodiments, although explanation has been given of color filter arrays with color filters for the 3 primary colors RGB, the type of the color filter is not limited thereto.

What is claimed is:

1. An imaging apparatus comprising:
   an image pickup device comprising a plurality of photoelectric conversion elements arrayed in a horizontal direction and a vertical direction;
   a color filter that is provided above a plurality of pixels configured by the plurality of photoelectric conversion elements, the color filter having repeatedly disposed 6×6 pixel basic array patterns configured with a first array pattern and a second array pattern disposed symmetrically about a point,
   wherein the first array pattern has a first filter corresponding to a first color that contributes most to obtaining a brightness signal placed at the 4 corner and center pixels of a 3×3 pixel square array, a second filter corresponding to a second color different from the first color placed in a line at the horizontal direction center of the square array, and a third filter corresponding to a third color different from the first color and the second color placed in a line at the vertical direction center of the square array, and
   wherein the second array pattern has the same placement of the first filter as that in the first array pattern and has the placement of the second filter and the placement of the third filter swapped over to that of the first array pattern;
   a drive section that drives the image pickup device so as to read pixel data only of pixels on lines at predetermined positions in the vertical direction;
   a pixel conversion section that converts pixel data of each line thinned and read from the image pickup device into Bayer array pixel data that is in a Bayer array pattern in which two pixels placed on one diagonal of a 2×2 pixel square array are pixels of the first color, and two pixels placed on the other diagonal are a pixel of the second color and a pixel of the third color; and
   a generation section that, based on the Bayer array pixel data, generates pixel data for each color for each of the pixels by interpolating pixel data for colors other than the corresponding color from pixel data of peripheral pixels.

2. The imaging apparatus of claim 1 wherein:
   the pixel conversion section converts pixel data of each line thinned and read from the image pickup device into the Bayer array pixel data by performing pixel mixing on pixel data of neighboring pixels of the same color in the horizontal direction to convert pixel data of each line thinned and read from the image pickup device.

3. The imaging apparatus of claim 2 wherein:

the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and the pixel conversion section converts pixel data of each line thinned and read from the image pickup device into the Bayer array pixel data by utilizing mixed pixel data of respectively neighboring pixel data of the first color in the first lines and in the third lines as each pixel of the first color at corresponding respective positions in the Bayer array pattern, utilizing pixel data of the third color in the first lines as each pixel of the third color at corresponding respective positions in the Bayer array pattern, and utilizing pixel data of the second color in the third lines as each pixel of the second color at corresponding respective positions in the Bayer array pattern.

4. The imaging apparatus of claim 2 wherein:

the drive section drives the image pickup device so as to thin and read pixel data only from pixels in the $(6n+2)^{th}$ (n=0, 1, 2, and so on) vertical direction second lines and the $(6n+5)^{th}$ (n=0, 1, 2, and so on) vertical direction fifth lines; and the pixel conversion section converts pixel data of each line thinned and read from the image pickup device into the Bayer array pixel data by utilizing respective pixel data of the first color in the second lines and in the fifth lines as each pixel of the first color at corresponding respective positions in the Bayer array pattern, utilizing mixed pixel data of neighboring pixel data of the second color in the second lines as each pixel of the second color at corresponding respective positions in the Bayer array pattern, and utilizing mixed pixel data of neighboring pixel data of the third color in the fifth lines as each pixel of the third color at corresponding respective positions in the Bayer array pattern.

5. The imaging apparatus of claim 2 wherein:

the drive section drives the image pickup device so as to thin and read pixel data only from pixels in the $(6n+1)^{th}$ (n=0, 1, 2, and so on) vertical direction first lines and the $(6n+4)^{th}$ (n=0, 1, 2, and so on) vertical direction fourth lines; and the pixel conversion section converts pixel data of each line thinned and read from the image pickup device into the Bayer array pixel data by utilizing mixed pixel data of respectively neighboring pixel data of the first color in the first lines and in the fourth lines as each pixel of the first color at corresponding respective positions in the Bayer array pattern, utilizing pixel data of the second color in the first lines as each pixel of the second color at corresponding respective positions in the Bayer array pattern, and utilizing mixed pixel data of neighboring pixel data of the third color in the fourth lines as each pixel of the third color at corresponding respective positions in the Bayer array pattern.

6. The imaging apparatus of claim 2 wherein:

the drive section drives the image pickup device so as to thin and read pixel data only from pixels in the $(12n+1)^{th}$ (n=0, 1, 2, and so on) vertical direction first lines and the $(12n+7)^{th}$ (n=0, 1, 2, and so on) vertical direction seventh lines; and the pixel conversion section converts pixel data of each line thinned and read from the image pickup device into the Bayer array pixel data by utilizing mixed pixel data of respectively neighboring pixel data of the first color in the first lines and in the seventh lines as each pixel of the first color at corresponding respective positions in the Bayer array pattern, utilizing pixel data of the second color in the vertical direction first lines as each pixel of the second color at corresponding respective positions in the Bayer array pattern, and utilizing pixel data of the third color in the seventh vertical direction lines as each pixel of the third color at corresponding respective positions in the Bayer array pattern.

7. The imaging apparatus of claim 2 wherein:

the drive section drives the image pickup device so as to thin and read pixel data only from pixels in the $(12n+2)^{th}$ (n=0, 1, 2, and so on) vertical direction second lines and the $(12n+8)^{th}$ (n=0, 1, 2, and so on) vertical direction eighth lines; and the pixel conversion section converts pixel data of each line thinned and read from the image pickup device into the Bayer array pixel data by utilizing respective pixel data of the first color in the second lines and in the eighth lines as each pixel of the first color at corresponding respective positions in the Bayer array pattern, utilizing mixed pixel data of neighboring pixel data of the second color in the vertical direction second lines as each pixel of the second color at corresponding respective positions in the Bayer array pattern, and utilizing mixed pixel data of neighboring pixel data of the third color in the vertical direction eighth lines as each pixel of the third color at corresponding respective positions in the Bayer array pattern.

8. The imaging apparatus of claim 2 wherein:

the drive section drives the image pickup device so as to thin and read pixel data only from pixels in the $(18n+2)^{th}$ (n=0, 1, 2, and so on) vertical direction second lines and the $(18n+11)^{th}$ (n=0, 1, 2, and so on) vertical direction eleventh lines; and the pixel conversion section converts pixel data of each line thinned and read from the image pickup device into the Bayer array pixel data by utilizing pixel data of the first color in the second lines and in the eleventh lines as each pixel of the first color at corresponding respective positions in the Bayer array pattern, utilizing mixed pixel data of neighboring pixel data of the third color in the vertical direction second lines as each pixel of the third color at corresponding respective positions in the Bayer array pattern, and utilizing pixel data of the second color in the vertical direction eleventh lines as each pixel of the second color at corresponding respective positions in the Bayer array pattern.

9. The imaging apparatus of claim 1 wherein:

for pixel data of each line thinned and read from the image pickup device, the pixel conversion section generates pixel data of the first color, the second color and the third color for each respective pixel position by performing summing of pixel data of pixels of the same color neighboring in the horizontal direction weighted according to pixel position, and the pixel conversion section generates the Bayer array pixel data based on the generated pixel data of each color.

10. The imaging apparatus of claim 9 wherein:

the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and the pixel conversion section generates pixel data of the first color, the second color and the third color for each respective pixel position by performing summing of pixel data of pixels of the same color respectively neighboring in the first lines and the third lines weighted according to pixel position, and the pixel conversion section generates the Bayer array pixel data based on the generated pixel data of each color.

11. The imaging apparatus of claim 9 wherein:
the drive section drives the image pickup device so as to thin and read pixel data only from pixels in the $(6n+2)^{th}$ (n=0, 1, 2, and so on) vertical direction second lines and the $(6n+5)^{th}$ (n=0, 1, 2, and so on) vertical direction fifth lines; and
the pixel conversion section generates pixel data of the first color, the second color and the third color for each respective pixel position by performing summing of pixel data of pixels of the same color respectively neighboring in the second lines and the fifth lines respectively weighted according to pixel position, and the pixel conversion section generates the Bayer array pixel data based on the generated pixel data of each color.

12. The imaging apparatus of claim 9 wherein:
the drive section drives the image pickup device so as to thin and read pixel data only from pixels in the $(6n+1)^{th}$ (n=0, 1, 2, and so on) vertical direction first lines and the $(6n+4)^{th}$ (n=0, 1, 2, and so on) vertical direction fourth lines; and
the pixel conversion section generates pixel data of the first color, the second color and the third color for each respective pixel position by performing summing of pixel data of pixels of the same color respectively neighboring in the first lines and the fourth lines respectively weighted according to pixel position, and the pixel conversion section generates the Bayer array pixel data based on the generated pixel data of each color.

13. The imaging apparatus of claim 9 wherein:
the drive section drives the image pickup device so as to thin and read pixel data only from pixels in the $(6n+1)^{th}$ (n=0, 1, 2, and so on) vertical direction first lines; and
the pixel conversion section generates pixel data of the first color, the second color and the third color for each respective pixel position by performing summing of pixel data of pixels of the same color neighboring in the first lines respectively weighted according to pixel position, and the pixel conversion section generates the Bayer array pixel data based on the generated pixel data of each color.

14. The imaging apparatus of claim 9 wherein:
the drive section drives the image pickup device so as to thin and read pixel data only from pixels in the $(6n+2)^{th}$ (n=0, 1, 2, and so on) vertical direction second lines; and
the pixel conversion section generates pixel data of the first color, the second color and the third color for each respective pixel position by performing summing of pixel data of pixels of the same color neighboring in the second lines respectively weighted according to pixel position, and the pixel conversion section generates the Bayer array pixel data based on the generated pixel data of each color.

15. The imaging apparatus of claim 9 wherein:
the drive section drives the image pickup device so as to thin and read pixel data only from pixels in the $(9n+2)^{th}$ (n=0, 1, 2, and so on) vertical direction second lines; and
the pixel conversion section generates pixel data of the first color, the second color and the third color for each respective pixel position by performing summing of pixel data of pixels of the same color neighboring in the second lines respectively weighted according to pixel position, and the pixel conversion section generates the Bayer array pixel data based on the generated pixel data of each color.

16. The imaging apparatus of claim 1 wherein:
the pixel conversion section respectively generates 2 lines' worth of pixel data corresponding to the Bayer array pattern from pixel data of each line thinned and read from the image pickup device, and converts the generated two lines of pixel data into the Bayer array pixel data.

17. The imaging apparatus of claim 16 wherein:
the drive section drives the image pickup device so as to thin and read pixel data only from pixels in the $(6n+1)^{th}$ (n=0, 1, 2, and so on) vertical direction first lines and the $(6n+3)^{th}$ (n=0, 1, 2, and so on) vertical direction third lines; and
the pixel conversion section converts pixel data of each line thinned and read from the image pickup device into the Bayer array pixel data by utilizing mixed pixel data of 2 sets of neighboring pixel data of the first color in the first lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing mixed pixel data of 2 sets of respectively neighboring pixel data of the first color in the third lines as each pixel of the first color at corresponding respective positions in $(2n+3)^{th}$ (n=0, 1, 2, and so on) vertical direction third Bayer array lines and in $(2n+4)^{th}$ (n=0, 1, 2, and so on) vertical direction fourth Bayer array lines of the Bayer array pattern, utilizing pixel data of the second color in the first lines and in the third lines as each pixel of the second color at corresponding respective positions in the first Bayer array lines and the third Bayer array lines of the Bayer array pattern, and utilizing pixel data of the third color in the first lines and in the third lines as each pixel of the third color at corresponding respective positions in the second Bayer array lines and the fourth Bayer array lines of the Bayer array pattern.

18. The imaging apparatus of claim 16 wherein:
the drive section drives the image pickup device so as to thin and read pixel data only from pixels in the $(6n+1)^{th}$ (n=0, 1, 2, and so on) vertical direction first lines; and
the pixel conversion section converts pixel data of each line thinned and read from the image pickup device into the Bayer array pixel data by utilizing mixed pixel data of 2 sets of respectively neighboring pixel data of the first color in the first lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing pixel data of the second color in the first lines as each pixel of the second color at corresponding respective positions in the first Bayer array lines of the Bayer array pattern, and utilizing pixel data of the third color in the first lines as each pixel of the third color at corresponding respective positions in the second Bayer array lines of the Bayer array pattern.

19. The imaging apparatus of claim 16 wherein:
the drive section drives the image pickup device so as to thin and read pixel data only from pixels in the $(12n+2)^{th}$ (n=0, 1, 2, and so on) vertical direction second lines and the $(12n+8)^{th}$ (n=0, 1, 2, and so on) vertical direction eighth lines; and the pixel conversion section converts pixel data of each line thinned and read from the image pickup device into the Bayer array pixel data by utilizing 2 sets of pixel data of the first color in the second lines as each pixel of the first color at corresponding respective positions in $(2n+1)^{th}$ (n=0, 1, 2, and so on) vertical direction first Bayer array lines and in $(2n+2)^{th}$ (n=0, 1, 2, and so on) vertical direction second Bayer array lines of the Bayer array pattern, utilizing pixel data of 2 sets of pixel data of the first color in the eighth lines as each pixel of the first color at corresponding respective positions in $(2n+3)^{th}$ (n=0, 1, 2, and so on) vertical direction third Bayer array lines and in $(2n+4)^{th}$ (n=0, 1, 2, and so on) vertical direction fourth Bayer array lines of the Bayer array pattern, utilizing mixed pixel data of neighboring pixel data of the second color in the second lines as each pixel of the second color at corresponding respective positions in the first Bayer array lines of the Bayer array pattern, utilizing mixed pixel data of neighboring pixel data of the second color in the eighth lines as each pixel of the second color at corresponding respective positions in the fourth Bayer array lines of the Bayer array pattern, utilizing mixed pixel data of neighboring pixel data of the third color in the second lines as each pixel of the third color at corresponding respective positions in the second Bayer array lines of the Bayer array pattern, and utilizing mixed pixel data of neighboring pixel data of the third color in the eighth lines as each pixel of the third color at corresponding respective positions in the third Bayer array lines of the Bayer array pattern.

20. The imaging apparatus of claim 1, wherein the first color is green (G), the second color is one color of red (R) or blue (B), and the third color is the other color of red (R) or blue (B).

21. A non-transitory storage medium storing an image capture program that causes a computer to execute processing function as a pixel conversion section configuring the imaging apparatus of claim 1.

* * * * *